United States Patent
Biggs et al.

(10) Patent No.: US 9,978,928 B2
(45) Date of Patent: May 22, 2018

(54) ROLLED AND COMPLIANT DIELECTRIC ELASTOMER ACTUATORS

(71) Applicant: Parker-Hannifin Corporation, Cleveland, OH (US)

(72) Inventors: Silmon James Biggs, Los Gatos, CA (US); Roger N. Hitchcock, San Leandro, CA (US); Trao Bach Ly, Mountain View, CA (US)

(73) Assignee: PARKER-HANNIFIN CORPORATION, Cleveland, OH (US)

( * ) Notice: Subject to any disclaimer, the term of this patent is extended or adjusted under 35 U.S.C. 154(b) by 600 days.

(21) Appl. No.: 14/421,450

(22) PCT Filed: Aug. 16, 2013

(86) PCT No.: PCT/US2013/055307
§ 371 (c)(1),
(2) Date: Feb. 13, 2015

(87) PCT Pub. No.: WO2014/028825
PCT Pub. Date: Feb. 20, 2014

(65) Prior Publication Data
US 2015/0221852 A1    Aug. 6, 2015

Related U.S. Application Data

(60) Provisional application No. 61/734,622, filed on Dec. 7, 2012, provisional application No. 61/734,616, filed
(Continued)

(51) Int. Cl.
*H01L 41/047* (2006.01)
*H01L 41/083* (2006.01)
(Continued)

(52) U.S. Cl.
CPC .......... *H01L 41/0472* (2013.01); *B32B 37/18* (2013.01); *B32B 38/0012* (2013.01);
(Continued)

(58) Field of Classification Search
CPC ..................................................... H01L 41/193
(Continued)

(56) References Cited

U.S. PATENT DOCUMENTS 4,373,525 A    2/1983  Kobayashi
4,455,181 A    6/1984  Lifshin
(Continued)

FOREIGN PATENT DOCUMENTS

EP    0154473 B1    5/1992
JP    2002-503008 A    1/2002
(Continued)

OTHER PUBLICATIONS

Handbook of adhesion technology, vol. 2, 2011, pp. 128, Print and electronic bundle ISBN 978-3-642-01170-2, DOI 10.1007/978-3-642-01169-6.

*Primary Examiner* — J. San Martin
(74) *Attorney, Agent, or Firm* — K&L Gates LLP

(57) ABSTRACT

An apparatus includes a substrate, a dielectric elastomer transducer electrically coupled to the substrate, and a compliant electrically conductive housing coupled to the dielectric elastomer transducer. A portion of the compliant electrically conductive housing projects through an opening defined in a housing. A method is disclosed for making the apparatus.

19 Claims, 32 Drawing Sheets

Related U.S. Application Data on Dec. 7, 2012, provisional application No. 61/734,609, filed on Dec. 7, 2012, provisional application No. 61/719,999, filed on Oct. 30, 2012, provisional application No. 61/717,810, filed on Oct. 24, 2012, provisional application No. 61/683,860, filed on Aug. 16, 2012.

(51) Int. Cl.

| | | |
|---|---|---|
| *H01L 41/193* | (2006.01) | |
| *H01L 41/27* | (2013.01) | |
| *H01L 41/053* | (2006.01) | |
| *B32B 37/18* | (2006.01) | |
| *B32B 38/00* | (2006.01) | |
| *H04R 19/04* | (2006.01) | |
| *H04R 31/00* | (2006.01) | |
| *B32B 37/14* | (2006.01) | |
| *B32B 38/10* | (2006.01) | |

(52) U.S. Cl.
CPC ........ *H01L 41/0475* (2013.01); *H01L 41/053* (2013.01); *H01L 41/0533* (2013.01); *H01L 41/0836* (2013.01); *H01L 41/193* (2013.01); *H01L 41/27* (2013.01); *H04R 19/04* (2013.01); *H04R 31/00* (2013.01); *B32B 37/144* (2013.01); *B32B 38/10* (2013.01); *B32B 2307/202* (2013.01); *B32B 2307/204* (2013.01); *B32B 2457/00* (2013.01); *H04R 2307/025* (2013.01); *Y10T 29/4913* (2015.01); *Y10T 29/49146* (2015.01); *Y10T 156/1043* (2015.01)

(58) Field of Classification Search
USPC .................................................. 310/328, 800
See application file for complete search history.

(56) References Cited

U.S. PATENT DOCUMENTS

| | | | |
|---|---|---|---|
| 4,561,830 A | 12/1985 | Bradley | |
| 4,594,058 A | 6/1986 | Fischell | |
| 4,671,792 A | 6/1987 | Borsanyi | |
| 4,704,369 A | 11/1987 | Nath et al. | |
| 4,728,265 A | 3/1988 | Cannon | |
| 4,808,084 A | 2/1989 | Tsubouchi et al. | |
| 5,057,372 A | 10/1991 | Imfeld | |
| 5,103,211 A | 4/1992 | Daoud et al. | |
| 5,104,707 A | 4/1992 | Watanabe et al. | |
| 5,192,197 A | 3/1993 | Culp | |
| 5,217,355 A | 6/1993 | Hyman et al. | |
| 5,256,474 A | 10/1993 | Johnston | |
| 5,322,975 A | 6/1994 | Nagy et al. | |
| 5,549,544 A * | 8/1996 | Young | A61B 8/08 601/2 |
| 5,630,709 A | 5/1997 | Bar-Cohen | |
| 5,637,421 A | 6/1997 | Poehler et al. | |
| 5,674,596 A | 10/1997 | Johnston | |
| 5,773,322 A * | 6/1998 | Weld | H01L 23/49517 257/E21.514 |
| 5,798,600 A | 8/1998 | Sager et al. | |
| 5,961,298 A | 10/1999 | Bar-Cohen et al. | |
| 5,964,583 A | 10/1999 | Danby | |
| 6,074,179 A | 6/2000 | Jokela et al. | |
| 6,284,396 B1 | 9/2001 | Kaule | |
| 6,336,367 B1 * | 1/2002 | Raisanen | G10H 3/185 73/632 |
| 6,524,675 B1 | 2/2003 | Mikami et al. | |
| 6,544,664 B1 | 4/2003 | Takahashi | |
| 6,685,442 B2 | 2/2004 | Chinn et al. | |
| 6,702,916 B2 | 3/2004 | Smith | |
| 6,807,729 B2 | 10/2004 | Kawashima et al. | |
| 7,353,747 B2 | 4/2008 | Swayze et al. | |
| 7,393,761 B2 | 7/2008 | Wajda et al. | |
| 7,618,680 B2 | 11/2009 | Gleason et al. | |
| 7,754,520 B2 | 7/2010 | Lee | |
| 7,883,783 B2 | 2/2011 | Nagatani | |
| 7,930,815 B2 | 4/2011 | Coleman et al. | |
| 7,969,070 B2 | 6/2011 | Jean-Mistral et al. | |
| 7,999,447 B2 | 8/2011 | Micallef | |
| 8,056,618 B2 | 11/2011 | Wagner et al. | |
| 8,667,849 B2 | 3/2014 | Sato et al. | |
| 8,926,171 B2 | 1/2015 | Danley et al. | |
| 8,934,261 B2 | 1/2015 | Lin et al. | |
| 9,000,317 B2 | 4/2015 | Cordoba | |
| 9,164,202 B2 | 10/2015 | Batchko et al. | |
| 2003/0168936 A1 | 9/2003 | Everingham et al. | |
| 2004/0035472 A1 | 2/2004 | Teltscher et al. | |
| 2004/0160118 A1 | 8/2004 | Knollenberg et al. | |
| 2004/0234401 A1 | 11/2004 | Banister | |
| 2004/0242956 A1 | 12/2004 | Scorvo | |
| 2005/0238506 A1 | 10/2005 | Mescher et al. | |
| 2007/0289377 A1 * | 12/2007 | Wagner | G01N 9/002 73/32 A |
| 2008/0248231 A1 | 10/2008 | Daigaku et al. | |
| 2008/0264441 A1 | 10/2008 | Takagi | |
| 2009/0050829 A1 | 2/2009 | Haynes et al. | |
| 2010/0172011 A1 | 7/2010 | Piroux et al. | |
| 2010/0273063 A1 | 10/2010 | Wallace et al. | |
| 2011/0216389 A1 | 9/2011 | Piroux et al. | |
| 2011/0222138 A1 | 9/2011 | Piroux et al. | |
| 2012/0126959 A1 | 5/2012 | Zarrabi et al. | |
| 2012/0307338 A1 | 12/2012 | Solarkski et al. | |
| 2013/0207793 A1 | 8/2013 | Weaber et al. | |
| 2015/0119529 A1 | 4/2015 | Laurino | |
| 2016/0204338 A1 | 7/2016 | Schmeer et al. | |
| 2016/0208944 A1 | 7/2016 | Muir et al. | |
| 2016/0230904 A1 | 8/2016 | Zarrabi et al. | |
| 2017/0279031 A1 | 9/2017 | Yoo et al. | |

FOREIGN PATENT DOCUMENTS

| | | | | |
|---|---|---|---|---|
| JP | 2013121269 A * | 6/2013 | ............ | H01G 4/186 |
| WO | WO 2006/071419 A2 | 7/2006 | | |
| WO | WO 2008/039658 A2 | 4/2008 | | |
| WO | WO 2012/032437 A1 | 3/2012 | | |

\* cited by examiner

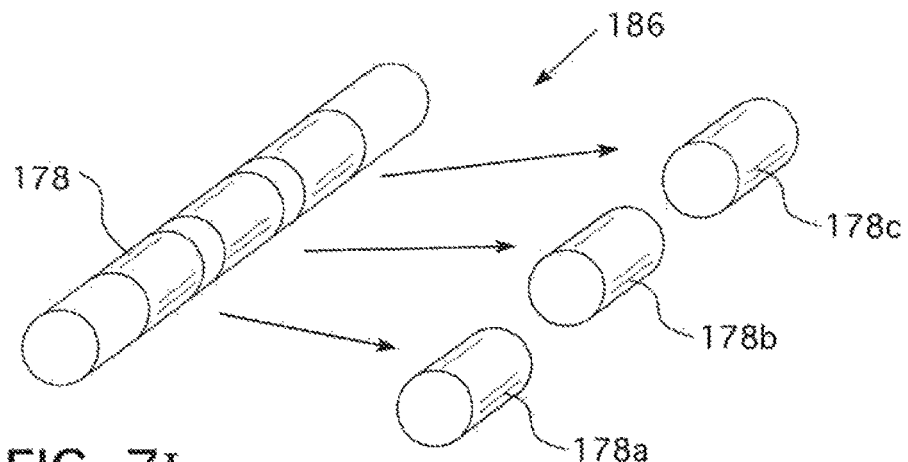
FIG. 7I
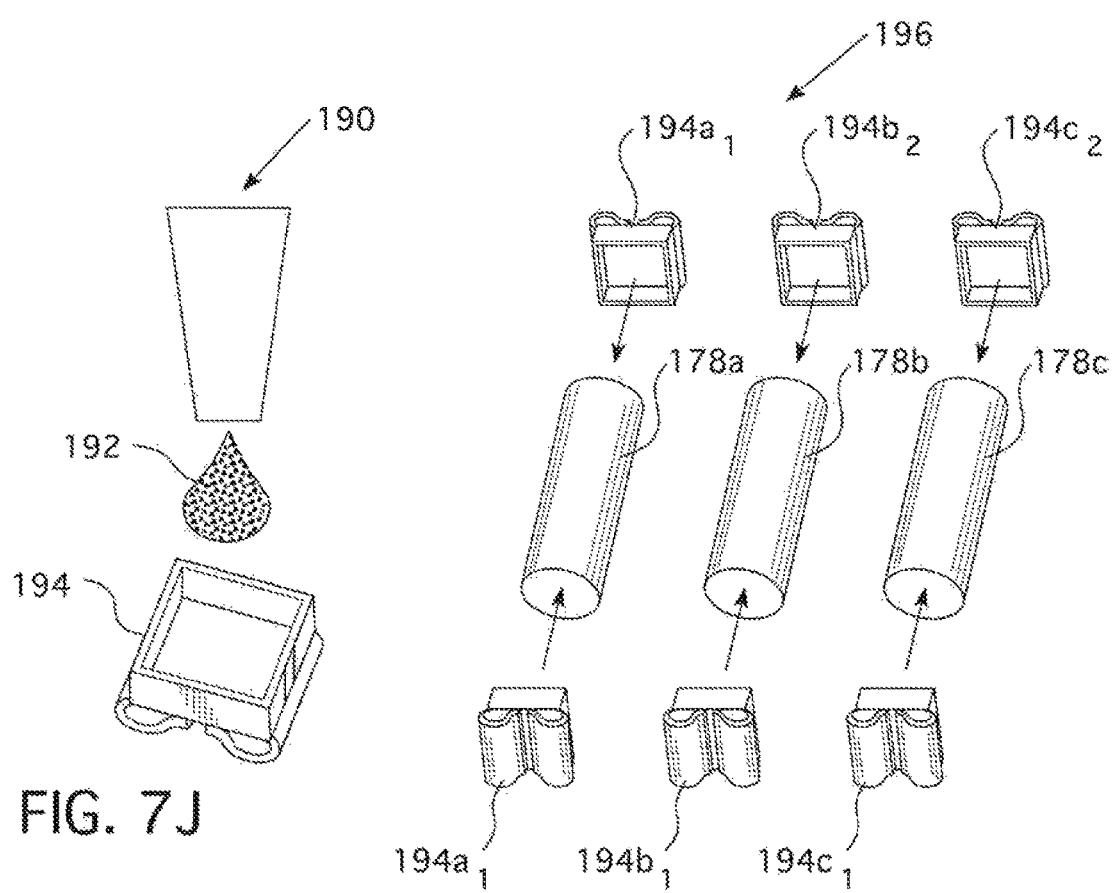
FIG. 7J
FIG. 7K

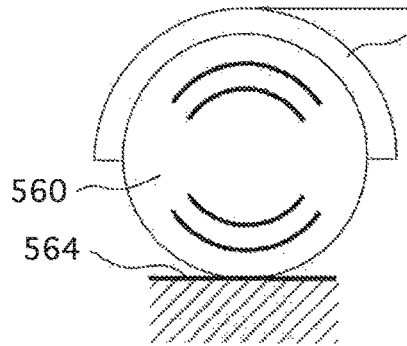
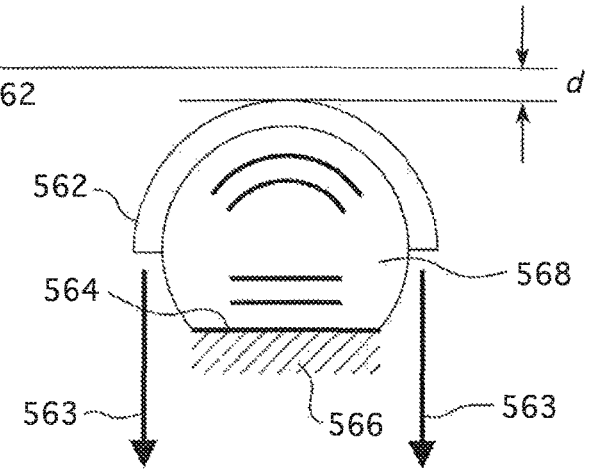
FIG. 44    FIG. 45
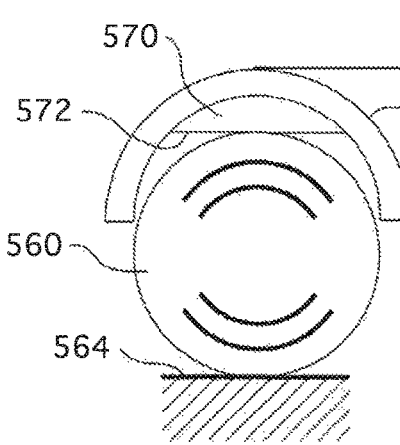
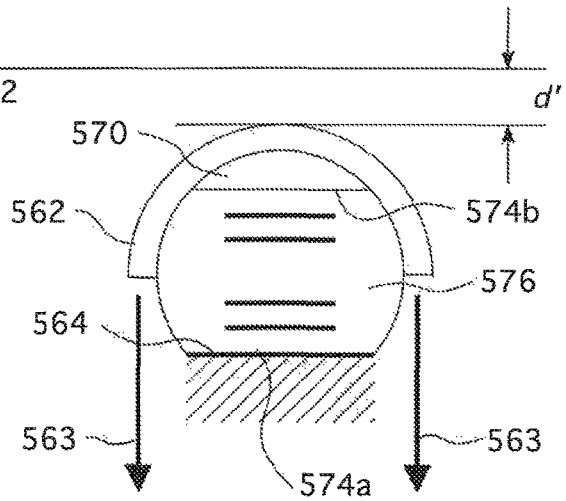
FIG. 46    FIG. 47

ROLLED AND COMPLIANT DIELECTRIC ELASTOMER ACTUATORS

RELATED APPLICATIONS

This application is the U.S. National Stage application filed under 35 U.S.C. § 371(c) of International Application No. PCT/US2013/055307, filed on Aug. 16, 2013, that claims the benefit, under 35 U.S.C. § 119(e), of U.S. Provisional Application Nos.: 61/683,860 filed Aug. 16, 2012 entitled "ROLL ACTUATORS IN AXIAL TENSION, MODEL AND DATA"; 61/717,810 filed Oct. 24, 2012 entitled "DIELECTRIC ELASTOMER TRANSDUCER WITH QUICK-CONNECT TERMINALS"; 61/719,999 filed Oct. 30, 2012 entitled "MACHINE AND METHODS FOR MAKING ROLLED DIELECTRIC ELASTOMER TRANSDUCERS"; 61/734,609 filed Dec. 7, 2012 entitled "RESONANT FREQUENCIES"; 61/734,616 filed Dec. 7, 2012 entitled "ROLL ACTUATORS"; and 61/734,622 filed Dec. 7, 2012 entitled "SKIN CONTACT WITH DIELECTRIC ELASTOMER ACTUATORS-SYSTEMS FOR SAFETY"; the entirety of each of which is incorporated herein by reference.

FIELD OF THE INVENTION

The present invention is directed in general to electroactive polymers and more specifically to compliant actuators comprising rolled dielectric elastomer transducers.

BACKGROUND OF THE INVENTION

A tremendous variety of devices used today rely on actuators of one sort or another to convert electrical energy to mechanical energy. Conversely, many power generation applications operate by converting mechanical action into electrical energy. Employed to harvest mechanical energy in this fashion, the same type of device may be referred to as a generator. Likewise, when the structure is employed to convert physical stimulus such as vibration or pressure into an electrical signal for measurement purposes, it may be characterized as a sensor. Yet, the term "transducer" may be used to generically refer to any of the devices.

A number of design considerations favor the selection and use of advanced dielectric elastomer materials, also referred to as "electroactive polymers", for the fabrication of transducers. These considerations include potential force, power density, power conversion/consumption, size, weight, cost, response time, duty cycle, service requirements, environmental impact, etc. As such, in many applications, electroactive polymer technology offers an ideal replacement for piezoelectric, shape-memory alloy and electromagnetic devices such as motors and solenoids.

An electroactive polymer transducer comprises two electrodes having deformable characteristics and separated by a thin elastomeric dielectric material. When a voltage difference is applied to the electrodes, the oppositely charged electrodes attract each other thereby compressing the polymer dielectric layer therebetween. As the electrodes are pulled closer together, the dielectric polymer film becomes thinner (the Z-axis component contracts) as it expands in the planar directions (along the X- and Y-axes), i.e., the displacement of the film is in-plane. The electroactive polymer film may also be configured to produce movement in a direction orthogonal to the film structure (along the Z-axis), i.e., the displacement of the film is out-of-plane. For example, U.S. Pat. No. 7,567,681 discloses electroactive polymer film constructs which provide such out-of-plane displacement—also referred to as surface deformation or as thickness mode deflection.

The material and physical properties of the electroactive polymer film may be varied and controlled to customize the deformation undergone by the transducer. More specifically, factors such as the relative elasticity between the polymer film and the electrode material, the relative thickness between the polymer film and electrode material and/or the varying thickness of the polymer film and/or electrode material, the physical pattern of the polymer film and/or electrode material (to provide localized active and inactive areas), the tension or pre-strain placed on the electroactive polymer film as a whole, and the amount of voltage applied to or capacitance induced upon the film may be controlled and varied to customize the features of the film when in an active mode.

Numerous applications exist that benefit from the advantages provided by such electroactive polymer films whether using the film alone or using it in an electroactive polymer actuator. One of the many applications involves the use of electroactive polymer transducers as actuators to produce haptic, tactile, vibrational feedback (the communication of information to a user through forces applied to the user's body), and the like, in user interface devices. There are many known user interface devices which employ such feedback, typically in response to a force initiated by the user. Examples of user interface devices that may employ such feedback include keyboards, keypads, game controller, remote control, touch screens, computer mice, trackballs, stylus sticks, joysticks, etc. The user interface surface can comprise any surface that a user manipulates, engages, and/or observes regarding feedback or information from the device. Examples of such interface surfaces include, but are not limited to, a key (e.g., keys on a keyboard), a game pad or buttons, a display screen, etc.

Use of electroactive polymer materials in consumer electronic media devices as well as the numerous other commercial and consumer applications highlights the need to increase production volume while maintaining precision and consistency of the films. There is also a need to ensure the safety of the consumer during use of electroactive polymer devices which may be operated at high operating voltages.

Conventional rolled dielectric elastomer transducer based cylindrical actuators are desirable because a cylindrical shape is functional and familiar. It matches many mechanical components, such as, for example, solenoids, air cylinders, shock absorbers, etc. so mounting hardware is readily available, for example, the clevis, the ball joint, and the threaded rod. Engineers' familiarity with cylindrical actuators simplifies their efforts to integrate them in new designs. Nevertheless, hollow, rolled dielectric elastomer tubes and tubes with an internal spring, called "spring rolls" have some drawbacks. Empty space inside the tube is wasted, making the transducer larger than strictly necessary. Also, accumulated tension from winding the outer layers of the tube tends to buckle and collapse the tube. In a tubular roll made with a highly prestrained acrylic dielectric, this imposed a practical limit of only a few turns per transducer.

Multilayer stacked actuators similarly eliminate wasted empty volume to maximize the density of active material. They may be particularly desired in applications where they are mounted onto a flat surface.

The present disclosure provides dielectric elastomer compliant actuators comprising dielectric elastomer transducers provided in various packages and configurations for interfacing with devices and users. Such compliant actuators may be integrated into various products and may be configured as active buttons and display surfaces for custom button clicks, navigation cues, and the like. Soft, shielded actuators may be projected through hard cases and housing of products such as smartphones, game consoles, pad computers, and the like.

SUMMARY OF THE INVENTION

In one embodiment, an apparatus comprises a substrate, a dielectric elastomer transducer electrically coupled to the substrate, and a compliant electrically conductive housing coupled to the dielectric elastomer transducer.

In another embodiment, an apparatus comprises a housing defining an opening, a substrate, a dielectric elastomer transducer electrically coupled to the substrate, and a compliant electrically conductive housing coupled to the dielectric elastomer transducer, wherein a portion of the compliant electrically conductive housing projects through the opening defined in the housing.

In yet another embodiment, a method comprises providing a substrate, attaching electrical terminals to the substrate, attaching a dielectric elastomer transducer to the electrical terminals, and applying an electrically insulative coating on the dielectric elastomer transducer.

These and other features and advantages of the invention will become apparent to those persons skilled in the art upon reading the details of the invention as more fully described below. In addition, variations of the processes and devices described herein include combinations of the embodiments or of aspects of the embodiments where possible are within the scope of this disclosure even if those combinations are not explicitly shown or discussed.

BRIEF DESCRIPTION OF THE DRAWINGS

The invention is best understood from the following detailed description when read in conjunction with the accompanying drawings. To facilitate understanding, the same reference numerals have been used (where practical) to designate similar elements are common to the drawings. Included in the drawings are the following:

FIGS. 7A-7K illustrate a manufacturing process for turning an electrode dielectric film laminate into a solid dielectric elastomer transducer roll, as shown in FIGS. 7I and 7K in accordance with one embodiment of the present invention, where:

FIG. 7A illustrates lamination of dielectric films in accordance with one embodiment of the present invention;

FIG. 7B illustrates cutting a frame away from the dielectric film laminate in accordance with one embodiment of the present invention;

FIG. 7C illustrates removal of the frame from the dielectric film laminate in accordance with one embodiment of the present invention;

FIG. 7D illustrates mounting a carrier plate with the dielectric film laminate on a rolling machine in accordance with one embodiment of the present invention;

FIG. 7E illustrates the process of rolling the dielectric film laminate by moving the carrier plate under a counter rotating scrub roller into a solid roll of dielectric elastomer film in accordance with one embodiment of the present invention;

FIG. 7F illustrates the process of rolling the dielectric film laminate shown in FIG. 7E towards the end of the process in accordance with one embodiment of the present invention;

FIG. 7G illustrates the carrier plate retracting after the rolling process is complete in accordance with one embodiment of the present invention;

FIG. 7H illustrates transfer of a solid dielectric elastomer transducer roll to a cutting fixture for segmenting the roll into individual solid dielectric elastomer transducer rolls shown in FIG. 7G in accordance with one embodiment of the present invention;

FIG. 7I illustrates the solid dielectric elastomer transducer roll segmented into individual solid dielectric elastomer transducer rolls in accordance with one embodiment of the present invention;

FIG. 7J illustrates application of conductive adhesive into a terminal cup for electrically attaching to ends of the solid dielectric elastomer transducer rolls shown in FIGS. 7H and 7I in accordance with one embodiment of the present invention;

FIG. 7K illustrates attaching and curing the terminal cups onto the ends of the solid dielectric elastomer transducer roll shown in FIG. 1 in accordance with one embodiment of the present invention;

FIG. 41 illustrates a solid dielectric elastomer transducer roll module attached to a flex circuit in accordance with one embodiment of the present invention;

FIG. 42 illustrates a partial cut-away view of the shield and the solid dielectric elastomer transducer roll module attached to the flex circuit in accordance with one embodiment of the present invention;

FIG. 43 illustrates a compound mold for molding the shield onto the solid dielectric elastomer transducer roll module to form the compliant actuator module in accordance with one embodiment of the present invention;

FIGS. 44-47 illustrate techniques for pre-straining circular solid dielectric elastomer transducer rolls into a stack orientation in accordance with one embodiment of the present invention, where:

FIGS. 44 and 45 illustrate a pulling technique in accordance with one embodiment of the present invention;

FIGS. 46 and 47 illustrate another pulling technique in accordance with one embodiment of the present invention;

FIG. 49 illustrates a top view of the cantilever beam inertial module in accordance with one embodiment of the present invention;

FIG. 50 illustrates a partial perspective view of the cantilever beam inertial module showing the mass attached to one end of the conductive strip in accordance with one embodiment of the present invention;

Figure 1:
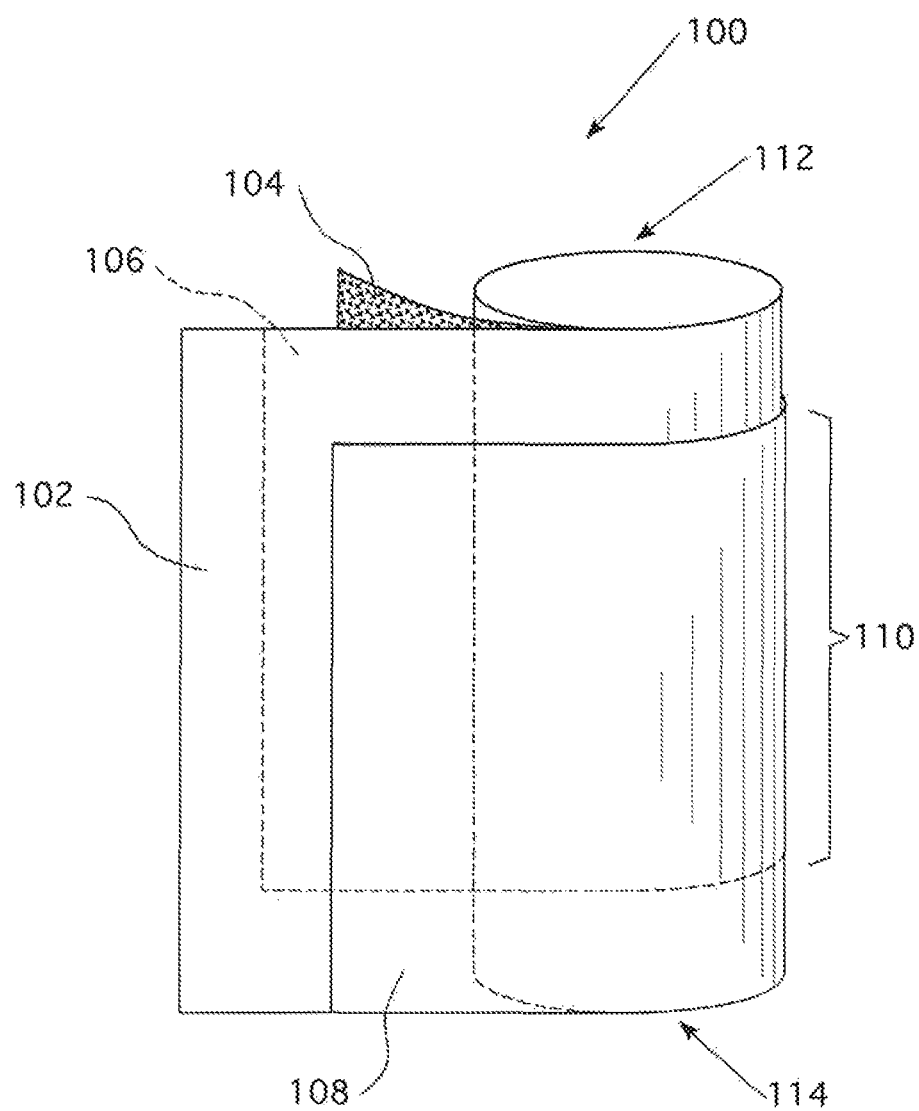
FIG. 1 illustrates a solid dielectric elastomer transducer roll in accordance with one embodiment of the present invention.

Variation of the invention from that shown in the figures is contemplated.

DETAILED DESCRIPTION OF THE INVENTION

Examples of electroactive polymer devices and their applications are described, for example, in U.S. Pat. Nos. 6,343,129; 6,376,971; 6,543,110; 6,545,384; 6,583,533; 6,586,859; 6,628,040; 6,664,718; 6,707,236; 6,768,246; 6,781,284; 6,806,621; 6,809,462; 6,812,624; 6,876,135; 6,882,086; 6,891,317; 6,911,764; 6,940,221; 7,034,432; 7,049,732; 7,052,594; 7,062,055; 7,064,472; 7,166,953; 7,199,501; 7,199,501; 7,211,937; 7,224,106; 7,233,097; 7,259,503; 7,320,457; 7,362,032; 7,368,862; 7,378,783; 7,394,282; 7,436,099; 7,492,076; 7,521,840; 7,521,847; 7,567,681; 7,595,580; 7,608,989; 7,626,319; 7,750,532; 7,761,981; 7,911,761; 7,915,789; 7,952,261; 8,183,739; 8,222,799; 8,248,750; and in U.S. Patent Application Publication Nos.; 2007/0200457; 2007/0230222; 2011/0128239; and 2012/0126959, the entireties of which are incorporated herein by reference.

In various embodiments, the present invention provides various improvements over conventional hollow rolled dielectric elastomer transducers and manufacturing processes for making same. Embodiments of the present invention overcome these drawbacks by winding dielectric elastomer films into a solid roll that does not waste space, and that does not collapse as turns are added. A rolling machine also is disclosed, along with a manufacturing process, materials, and fixtures for manufacturing dielectric elastomer actuator rolls with the machine, as described herein in the detailed description of the invention section of the present disclosure.

The various embodiments discussed hereinbelow in connection with FIGS. 1-19 provide a dielectric elastomer transducer rolls formed by rolling laminated films into a compact spiral, which will be referred to herein as "solid." Multiple individual solid dielectric elastomer transducer rolls can be produced by segmented cutting of the transducer rolls, where the cutting affords electrical connections to the ends of the rolls. A conductive adhesive formulated with solvent may be used to swell the ends of the roll to improve mechanical and electrical connection of the rolls to the terminals. Also provided is a rolling machine for dielectric elastomer actuators comprised of a scrub roller that counter-rotates with respect to an advancing plate. Another rolling machine is provided in which motion control is simplified by spinning the scrub roller faster than the carrier plate advances. A non-stick textile cover for the scrub roller is provided to minimize adhesion by minimizing contact area through the use of knit threads that can locally deflect to minimize contact stress. An electrode pattern is also provided for transducer rolls in which electrodes overlap to support areas of the roll that could otherwise buckle and initiate wrinkles. Also provided are novel fixtures for cutting the roll and adhering terminals, to be used in conjunction with the rolling machine.

The solid transducer rolls overcome buckling problems that normally would limit the number of turns that can be added to a hollow type transducer roll. Solid transducer rolls also save space that is wasted by the hollow type rolls known in the art. A rolling machine forms solid rolls with geometric tolerances finer than hand-rolling, at greater speed and lower cost. A compliant, textile, non-stick cover for the scrub roller in the machine simplifies motion control and reduces machine cost. An overlapping electrode pattern prevents wrinkles.

The present disclosure also provides dielectric elastomer based compliant actuators that use electrical energy to generate a force which conveys information to a user in contact with the compliant which can be integrated into a variety of product packages. The compliant actuators comprise at least one solid rolled dielectric elastomer transducers provided in various package configurations for interfacing with devices and users. Such actuators may be integrated into various products and may be configured as active buttons and display surfaces for custom button clicks, navigation cues, and the like. Soft, shielded actuators may be project through hard cases and housing of products such as smartphones, game consoles, pad computers, and the like. With suitable packaging techniques, the dielectric elastomer actuators can be safely touched by a user.

Such compliant actuators and related packaging therefore are described in connection with FIGS. 35-56. However, prior to describing FIGS. 35-56, the present disclosure initially turns to a description of FIGS. 1-34 to provide a context for the description that follows.

FIG. 1 illustrates a solid dielectric elastomer transducer roll 100 in accordance with one embodiment of the present invention. The solid dielectric elastomer transducer roll 100 comprised of two layers of dielectric film 102, 104, one of which has been patterned with one or more layers of electrodes 106, 108 on both sides. The layers of dielectric film 102, 104 are wound together into a tight solid spiral cylinder. The area 110 in which the electrodes 106, 108 overlap acts as a dielectric elastomer transducer. Electrical connection to the two plates of the capacitor can be made where the electrodes 106, 108 meet the ends of the cylinder. The electrodes 106, 108 are offset relative to each other to provide electrical connection at the ends 112, 114 of the solid dielectric elastomer transducer roll 100 such that the first electrode 106 is accessible at the top 112 and the second electrode 108 is accessible at the bottom 114 of the transducer 100. Although in the illustrated embodiment, the solid dielectric elastomer transducer roll 100 has a right circular cylindrical form, other forms are contemplated such as triangular, square, rectangular, among other polyhedral forms.

Figure 2:
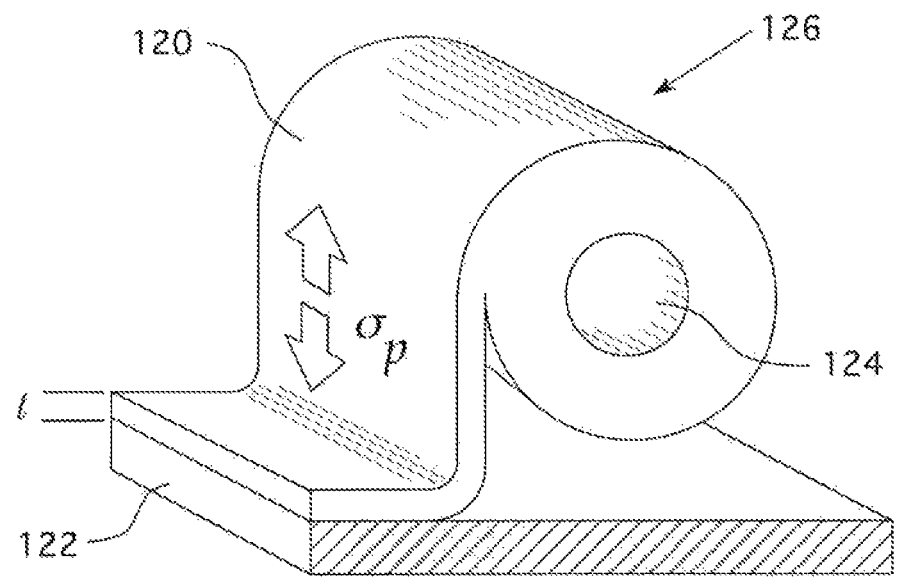
FIG. 2 illustrates tension $\sigma_P$ that accumulates when removing film from a liner while winding a hollow rolled dielectric elastomer transducer.

FIG. 2 illustrates tension $\sigma_P$ that accumulates when removing film 120 from a liner 122 while winding a hollow 124 rolled dielectric elastomer transducer 126. Some peeling stress $\sigma_p$, is unavoidable when removing the film 120 having a thickness "t" from the liner 122.

Figure 3:
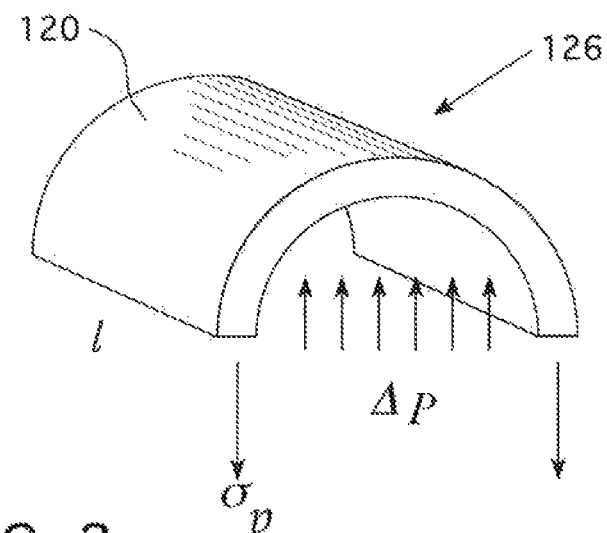
FIG. 3 illustrates radial stress $\Delta P$ developed in the hollow dielectric elastomer transducer rolls shown in FIG. 2 caused by the tension $\sigma_P$.

FIG. 3 illustrates radial stress ΔP developed in the hollow rolled dielectric elastomer transducer 126 shown in FIG. 2 caused by the tension $\sigma_P$ created when the film 120 is peeled from the liner 122 (not shown). Radial stress ΔP (pressure) in the compressed layers below must support the tension of each new wrap.

Figure 4:
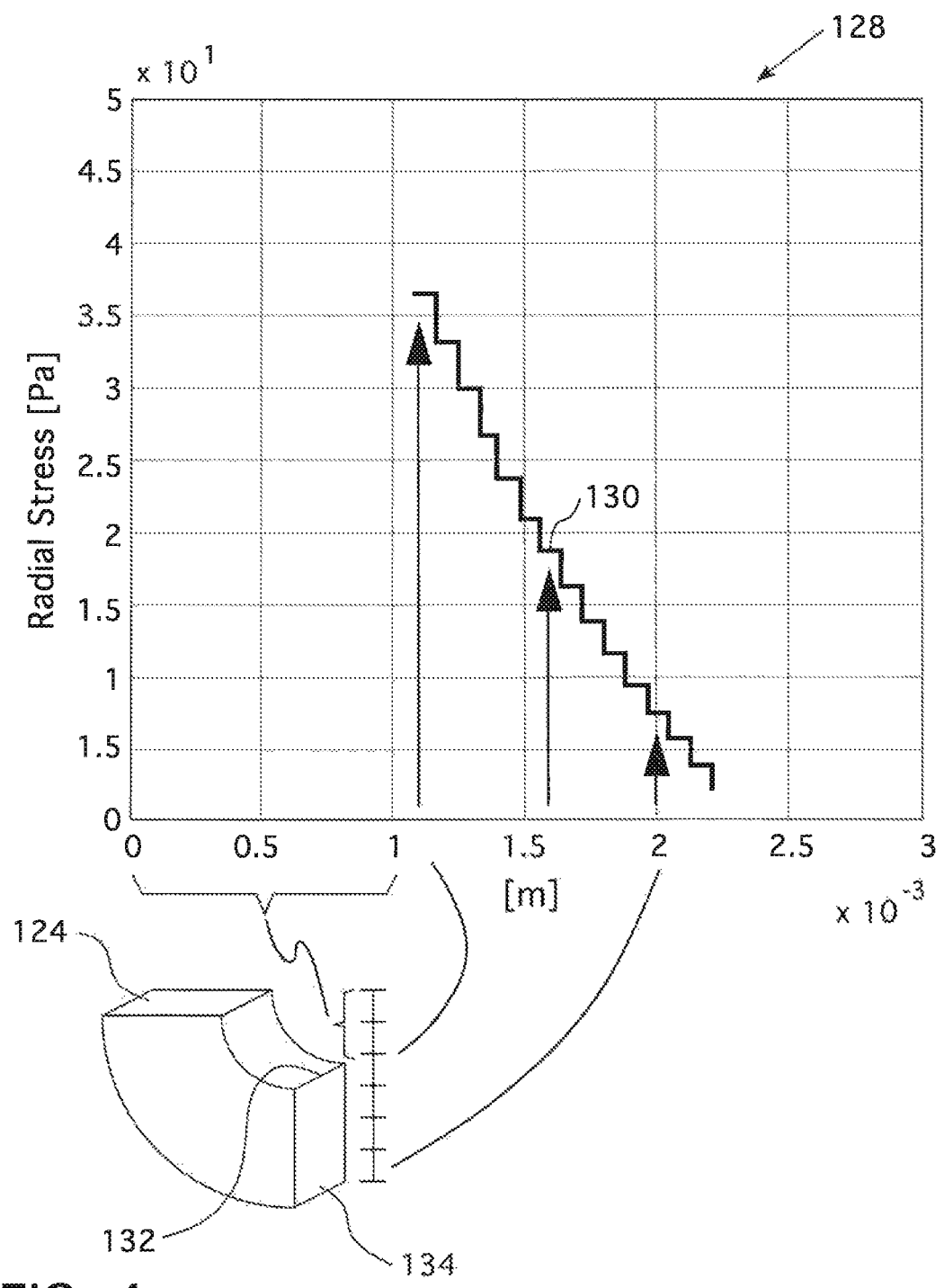
FIG. 4 is a graphical illustration depicting the accumulation of radial stress $\Delta P$ in the hollow dielectric elastomer transducer rolls shown in FIG. 2 as additional wraps are added to the hollow rolled dielectric elastomer transducer.

FIG. 4 is a graphical illustration depicting the accumulation of radial stress ΔP in the hollow rolled dielectric elastomer transducer 126 shown in FIG. 2 as additional wraps are added to the hollow rolled dielectric elastomer transducer 126. As more wraps are added the radial stress ΔP (pressure) in the center increases. If the force becomes large enough, the inner layers may delaminate and buckle, like an arch collapsing. As indicated by the radial stress ΔP [Pa] versus radial distance [m] curve 130 in graph 128, the radial stress ΔP on the innermost layer 132 is much higher than the radial stress ΔP on the outermost layer 134.

In the context of FIGS. 2-4, the peel stress $\sigma_p$ and strain in a single layer of dielectric film 120 are given below for values typical of a dielectric elastomer coating:

$$\sigma_p = \frac{\sigma_{PEEL}}{t} = \frac{[3.8\ N/m]}{[80E-6\ m]} = 0.048\ MPa \quad \text{Eq. 1}$$

$$s = \frac{\sigma_p}{Y} = \frac{[0.048\ MPa]}{[0.6\ MPa]} = 0.08 = 8\%\ \text{strain} \quad \text{Eq. 2}$$

The force balance for a half-wrap of film, as shown in FIG. 3, can be solved for the radial stress ΔP.

$$\sum F_z = -2\sigma_p t l + 2rl\Delta P = 0 \quad \text{Eq. 3}$$

$$\Delta P = \frac{\sigma_p t}{r} = \frac{\sigma_{PEEL}}{r} \quad \text{Eq. 4}$$

The radial stress ΔP in layer "i" is due to the accumulated stress of the layers above it as given in the equation below. For typical values of peel stress $\sigma_P$ on a hollow rolled dielectric elastomer transducer 126 with 1 mm internal radius, the calculated pressures have been plotted in FIG. 4.

$$P_i = \Delta P_i + \sum_0^{i-1} \Delta P \quad \text{Eq. 5}$$

Figure 5:
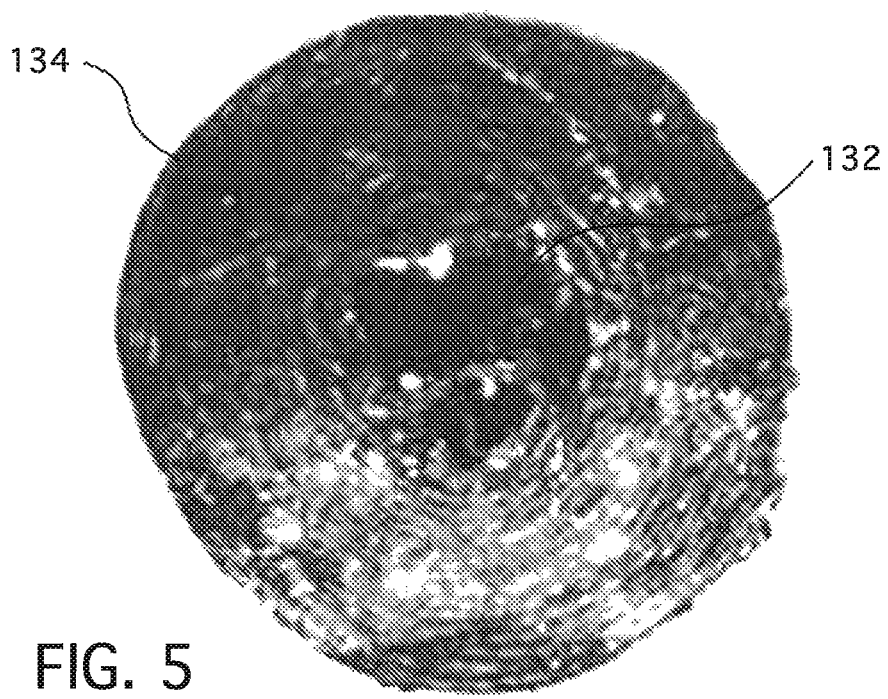
FIG. 5 illustrates inner windings of a hollow dielectric elastomer transducer rolls that have collapsed under the accumulated radial stress P imposed by tension $\sigma_P$ in the outer windings.

FIG. 5 illustrates inner windings 132 of the hollow rolled dielectric elastomer transducer 126 that have collapsed under the accumulated radial stress P imposed by tension $\sigma_P$ in the outer windings 134. This "collapsing of the inner layers" problem with the conventional hollow rolled dielectric elastomer transducer 126 provides the motivation for the present inventors' development of the solid dielectric elastomer transducer roll 100 shown in FIG. 6.

Figure 6:
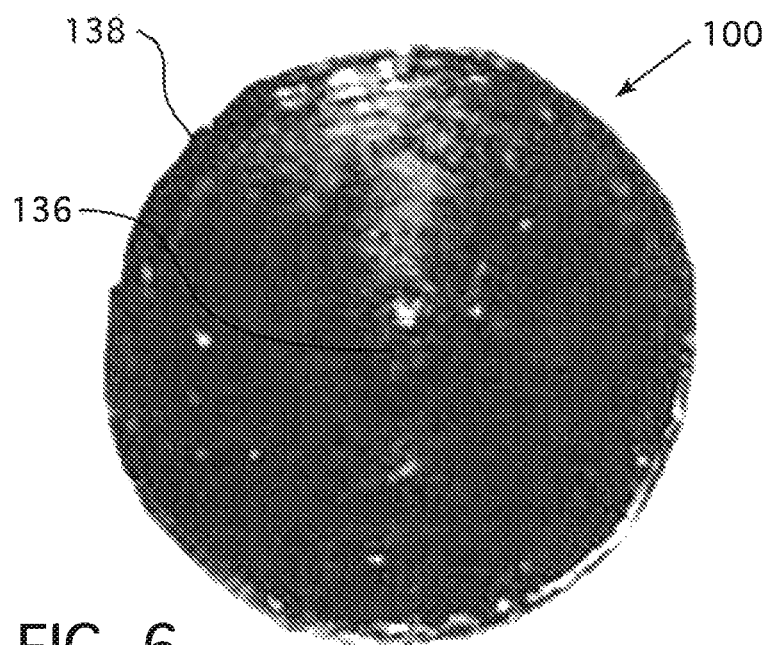
FIG. 6 illustrates a cylindrical solid dielectric elastomer transducer roll in accordance with one embodiment of the present invention.

FIG. 6 illustrates a cylindrical solid dielectric elastomer transducer roll 100 in accordance with one embodiment of the present invention. The cylindrical solid dielectric elastomer transducer roll 100 does not exhibit a collapse of the inner layers 136 under the accumulated radial stress P imposed by tension $\sigma_P$ in the outer windings 138.

Figure 7A:
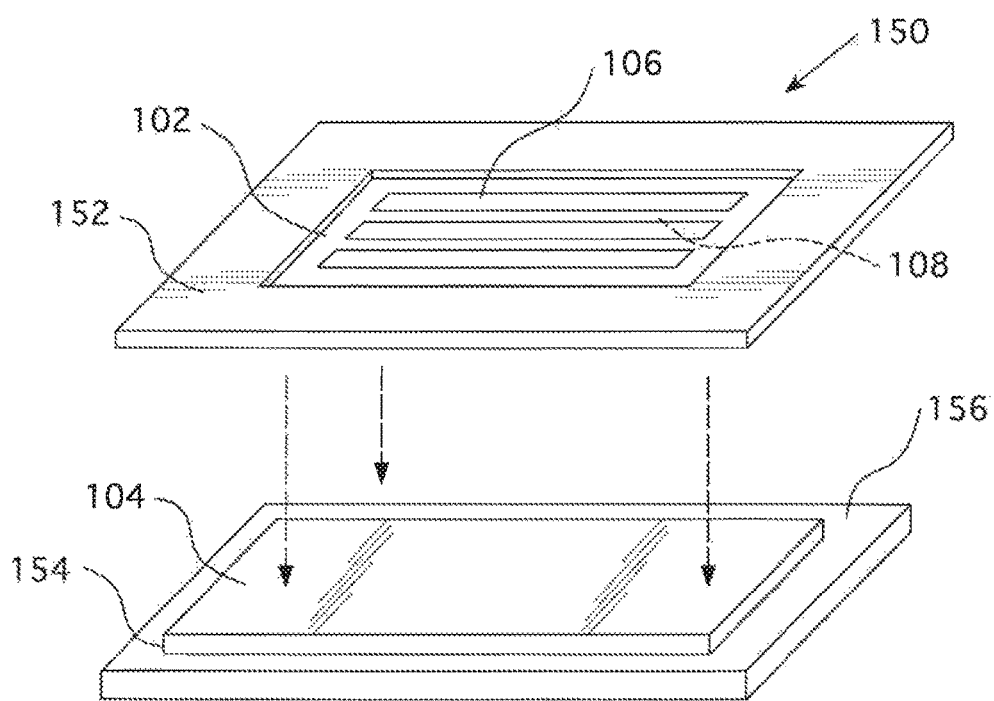

FIGS. 7A-7K illustrate a manufacturing process for turning an electroded dielectric film laminate 101 into a solid dielectric elastomer transducer roll 178, as shown in FIGS. 7I and 7K in accordance with one embodiment of the present invention. The process rolls the dielectric film laminate 101 into a tight spiral without an opening extending axially in the center of the solid dielectric elastomer transducer roll 178.

FIG. 7A illustrates a step of the process where two dielectric films 102, 104 are laminated 150 in accordance with one embodiment of the present invention. The first dielectric film 102 comprises a first electrode layer 106 on a top portion and a second electrode layer 108 on a bottom portion. The first dielectric film 102 with the electrodes 106, 108 patterned on both sides thereof are held in tension (pre-stressed) in a rigid frame 152. The first film 102 with the frame 152 is then laminated to the second dielectric film 104 while it is still attached to the liner 154 used to coat it. The electroded dielectric film laminate 101 (not shown in FIG. 7A) comprising the laminated films 102, 104 is positioned on a carrier plate 156, which will be used to hold the dielectric film laminate 101 during the rolling process.

Figure 7B:
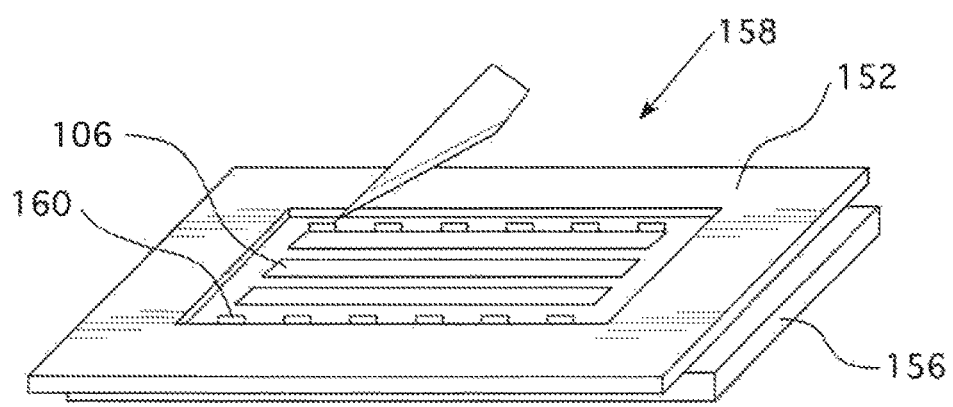

FIG. 7B illustrates another step of the process where the frame 152 is cut 158 away from the dielectric film laminate 101 (not shown in FIG. 7B) in accordance with one embodiment of the present invention. The cut path 160 is inside the inner perimeter of the frame 152.

Figure 7C:
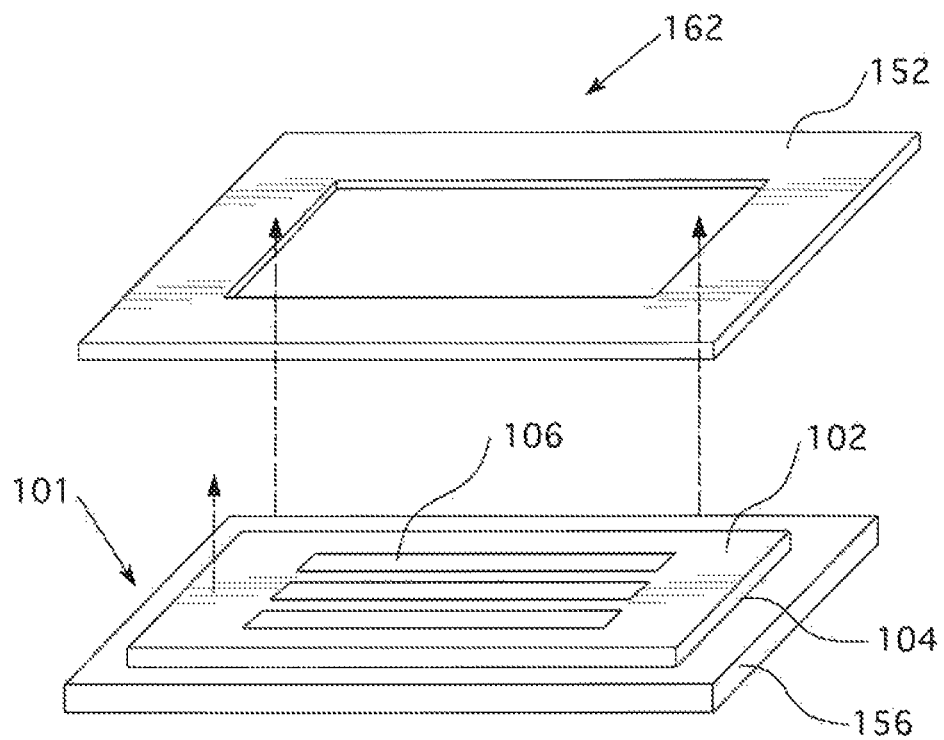

FIG. 7C illustrates another step of the process where the frame 152 is removed 162 from the dielectric film laminate 101 in accordance with one embodiment of the present invention.

Figure 7D:
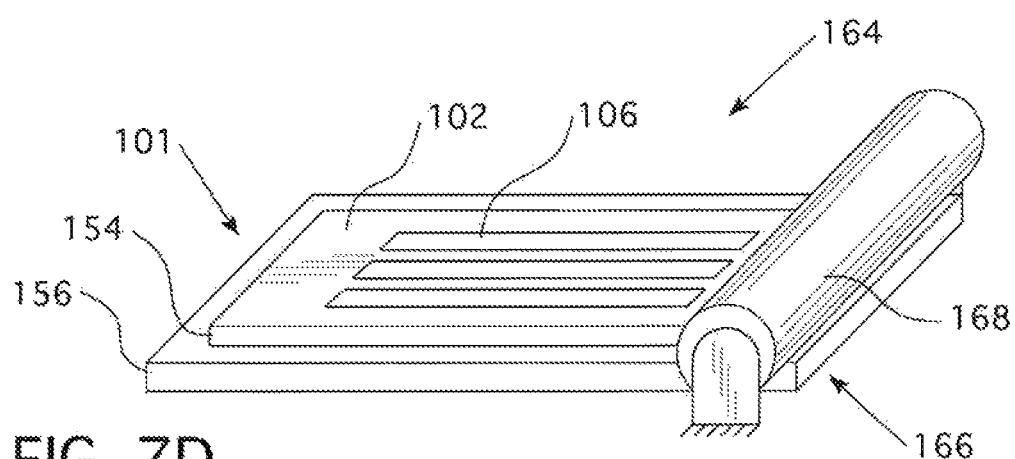

FIG. 7D illustrates another step of the process where the carrier plate 156 with the dielectric film laminate 101 is mounted 164 on a rolling machine 166 in accordance with one embodiment of the present invention. The rolling machine 166 comprises a scrub roller 168, which rolls up the dielectric film laminate 101.

Figure 7E:
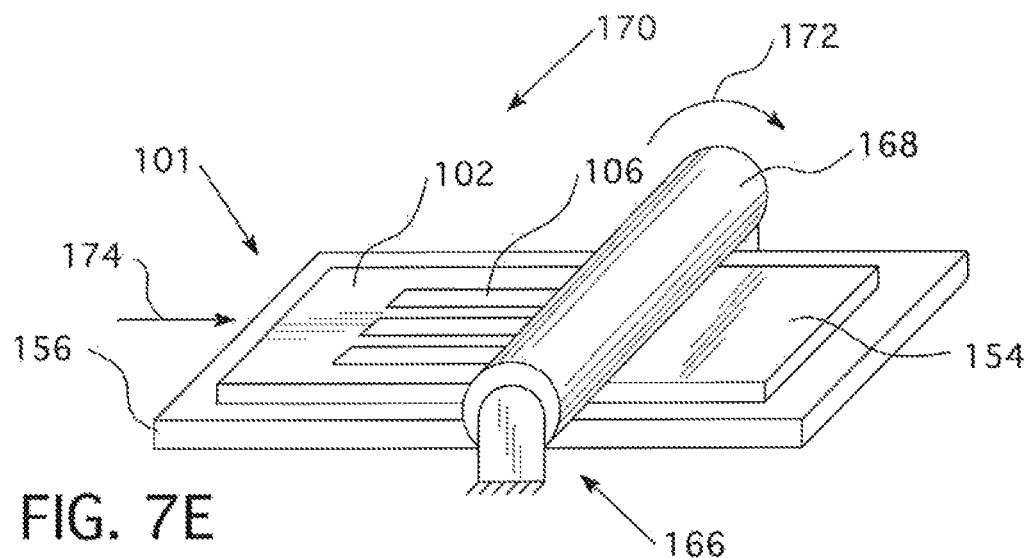

FIG. 7E illustrates another step in the process where the dielectric film laminate 101 on the carrier plate 156 is rolled into a solid roll of dielectric elastomer film under a counter rotating 172 scrub roller 168 as the carrier plate 156 is moved 170 in direction 174 by a conveyor or other suitable drive mechanism in accordance with one embodiment of the present invention. As the dielectric film laminate 101 is rolled, it is released from the liner 154. The process continues until the entire dielectric film laminate 101 is rolled.

Figure 7F:
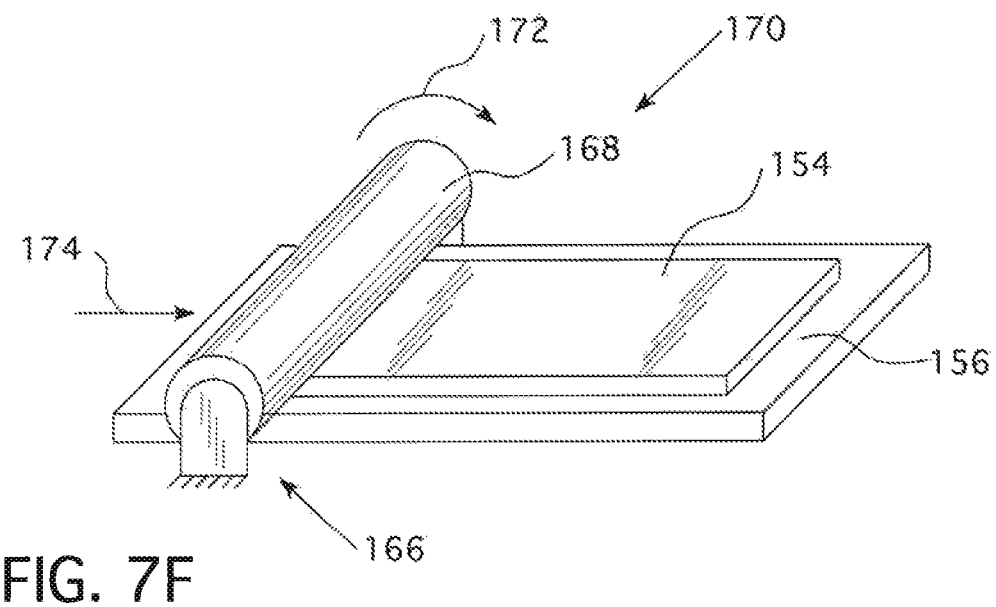

FIG. 7F illustrates the process of rolling the dielectric film laminate 101 shown in FIG. 7E towards the end of the process in accordance with one embodiment of the present invention.

Figure 7G:
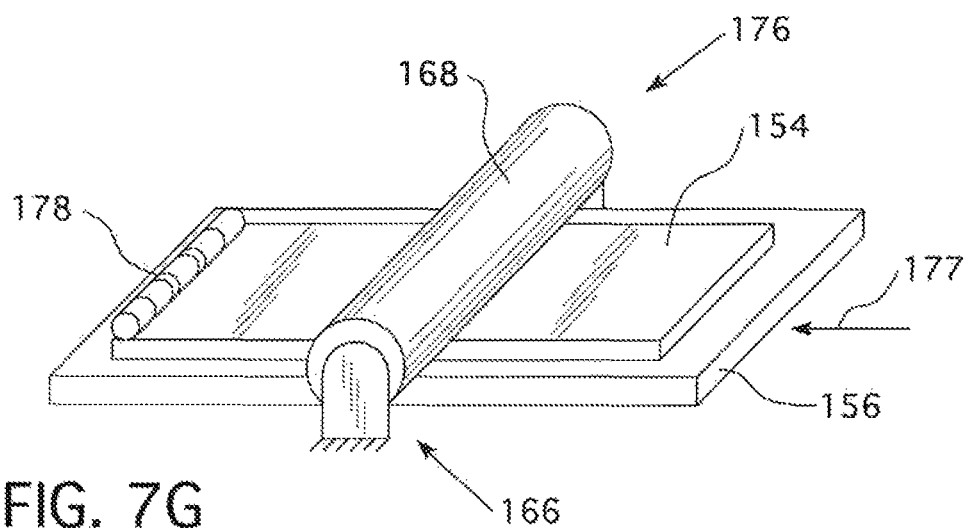

FIG. 7G illustrates another step of the process where the carrier plate 156 is retracted 176 in direction 177 after the rolling process is complete in accordance with one embodiment of the present invention. As shown, a solid dielectric elastomer transducer roll 178 is provided at the end of this step.

Figure 7H:
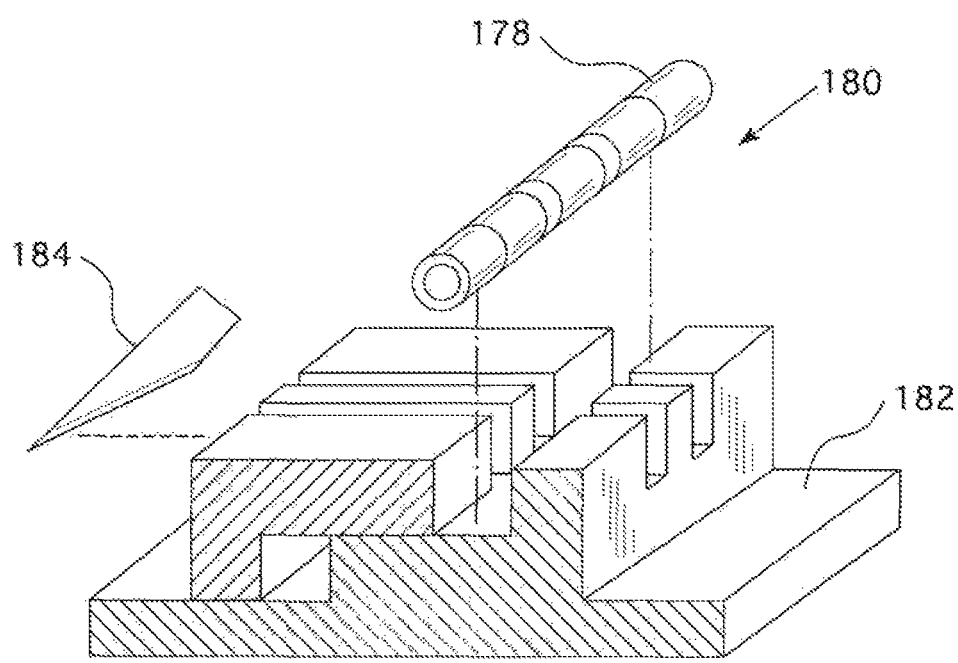

FIG. 7H illustrates another step in the process where the solid dielectric elastomer transducer roll 178 is transferred 180 to a cutting fixture 182 for segmenting the roll 178 with a cutter 184, such as a blade or slitter, into individual solid dielectric elastomer transducer rolls shown in FIG. 7G in accordance with one embodiment of the present invention.

FIG. 7I illustrates another step in the process where the solid dielectric elastomer transducer roll 178 is segmented 186 into individual solid dielectric elastomer transducer rolls 178a, 178b, and 178c in accordance with one embodiment of the present invention.

FIG. 7J illustrates another step in the process where a conductive adhesive 192 is applied 190 into an electrical terminal 194 having a cup shape for electrically attaching to ends of the solid dielectric elastomer transducer rolls 178a, 178b, and 178c shown in FIGS. 7H and 7I in accordance with one embodiment of the present invention.

FIG. 7K illustrates another step in the process where terminals $194a_1$, $194a_2$ are attached and cured 196 onto the ends of the solid dielectric elastomer transducer roll 178a, terminals $194b_1$, $194b_2$ are attached and cured 196 onto the ends of the solid dielectric elastomer transducer roll 178b, and terminals $194c_1$, $194c_2$ are attached and cured 196 onto the ends of the solid dielectric elastomer transducer roll 178c in accordance with one embodiment of the present invention.

Figure 8:
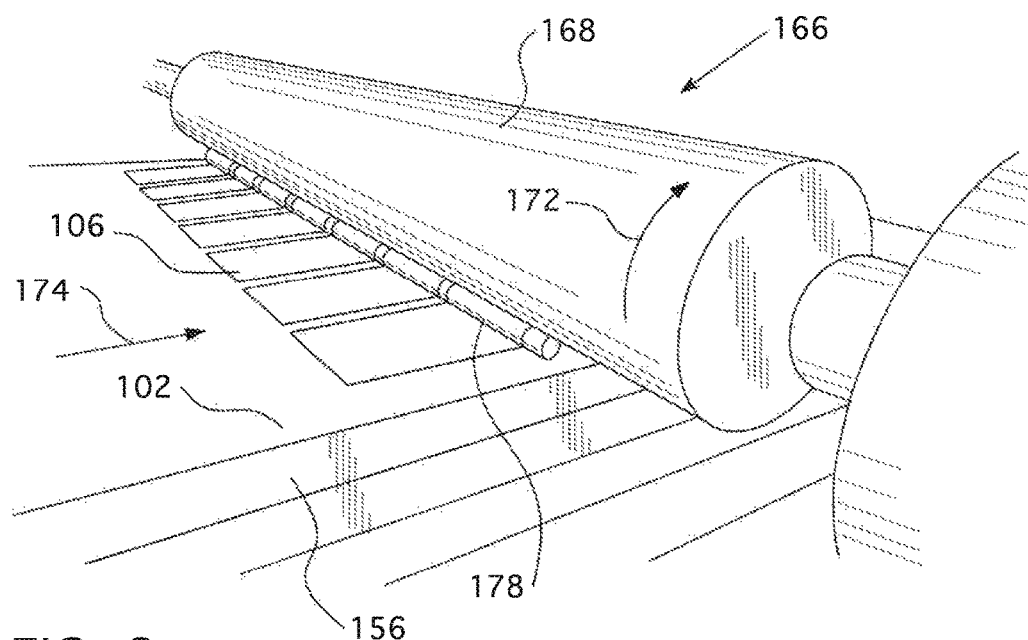
FIG. 8 is a detail view of the rolling machine used in steps illustrated in FIGS. 7D-F in accordance with one embodiment of the present invention.

FIG. 8 is a detail view of the rolling machine 166 used in the steps illustrated in FIGS. 7D-G in accordance with one embodiment of the present invention.

Figure 9:
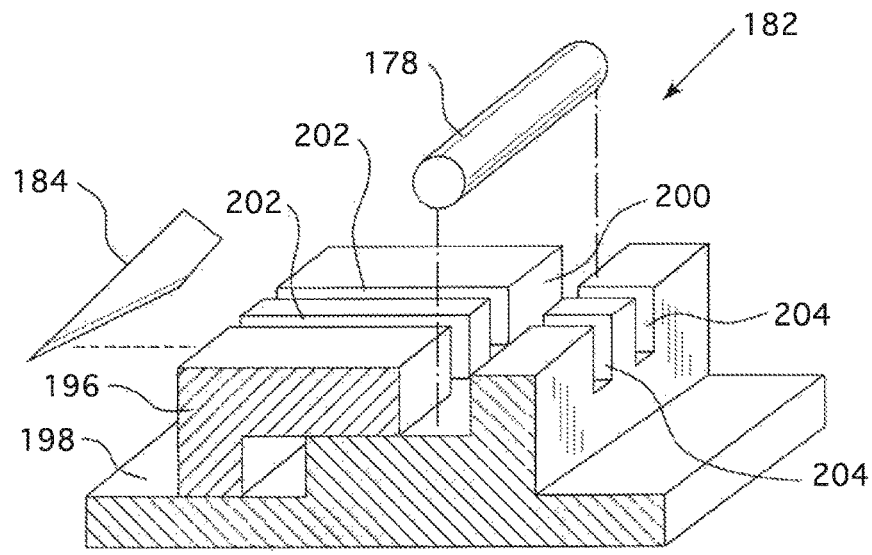
FIG. 9 is a detail view of the cutting fixture for segmenting the solid dielectric elastomer transducer roll into individual solid dielectric elastomer transducer rolls shown in FIGS. 7H and 7J in accordance with one embodiment of the present invention.

FIG. 9 is a detail view of the cutting fixture 182 for segmenting the solid dielectric elastomer transducer roll 178 into individual solid dielectric elastomer transducers rolls 178a, 178b, and 178c shown in FIGS. 7H and 7J in accordance with one embodiment of the present invention. The cutting fixture 182 comprises a movable jaw 196 and a fixed jaw 198. The movable jaw comprises alignment slots 202 and the fixed jaw comprises alignment slots 204, which are aligned with the alignment slots 202 of the movable jaw 202. The cutting fixture comprises an aperture for receiving the solid dielectric elastomer transducer roll 178 therein. The movable jaw 196 moves relative to the fixed jaw 198 to define a longitudinal aperture 200 for receiving and holding the solid dielectric elastomer transducer roll 178 in place during the segmenting process. The cutter 184 is advanced through the alignment slots 202 in the movable jaw 196, through the solid dielectric elastomer transducer roll 178, and the alignment slots 204 in the fixed jaw 198. The clamping action of the jaws 196, 198 also straightens the solid dielectric elastomer transducer roll 178 within the aperture 200 in preparation for segmentation.

Figure 10:
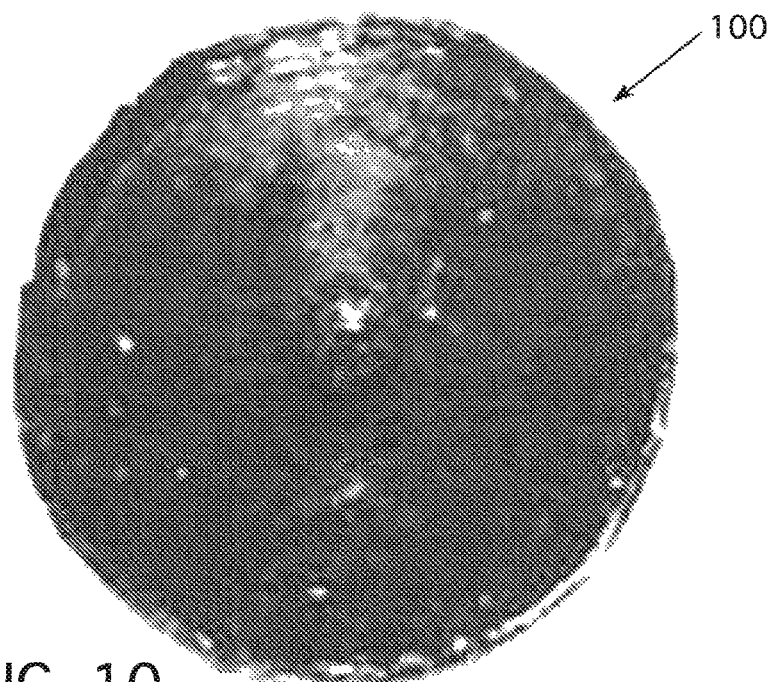
FIG. 10 is an end view of an individual segmented solid dielectric elastomer transducer roll in accordance with one embodiment of the present invention after segmentation and prior to exposing the end to a solvent.

FIG. 10 is an end view of an individual segmented solid dielectric elastomer transducer roll 100 in accordance with one embodiment of the present invention after segmentation and prior to exposing the end to a solvent.

Figure 11:
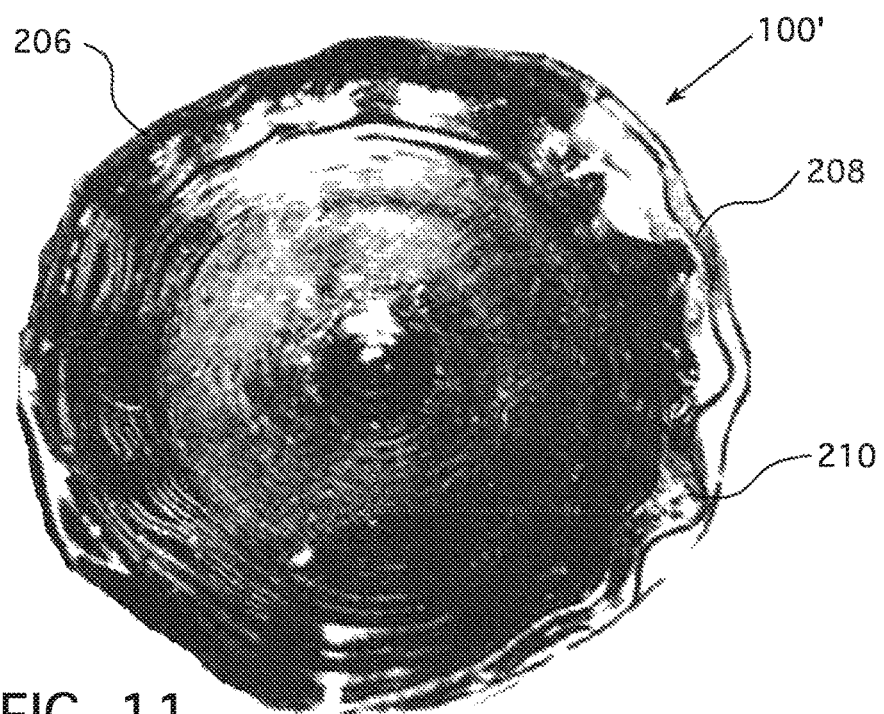
FIG. 11 is an end view of an individual segmented solid dielectric elastomer transducer roll after the application of a solvent to cause local swelling and separation of the layers in accordance with one embodiment of the present invention.

FIG. 11 is an end view of an individual segmented solid dielectric elastomer transducer roll 100' after the application of a solvent to the end to cause local swelling and separation of the layers 206, 208, and 210 in accordance with one embodiment of the present invention. This improves penetration of the conductive adhesive 192, shown in FIG. 7J. During the curing process 196 shown in FIG. 7K, the solvent evaporates, leaving inter-digitated glue that makes a robust electrical and mechanical connection between the capping end-terminal 194 shown in FIGS. 7J and 7K and the electrodes 106, 108 of the solid dielectric elastomer transducer roll 100. In one embodiment, the electrically conductive adhesive 192 may be formulated with a solvent that swells the ends of the roll 100 to improve mechanical and electrical connection of the rolls 100 to the terminals 194.

Figure 12:
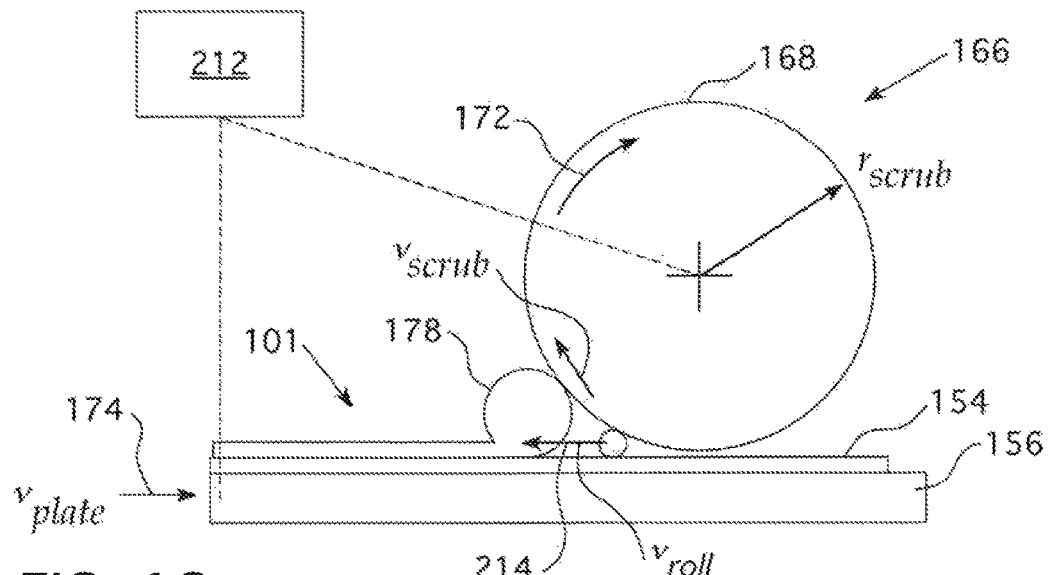
FIG. 12 illustrates a motion control system for controlling the rolling process of rolling up a solid dielectric elastomer transducer roll with a carrier plate under a scrub roller as illustrated in FIGS. 7D-F and FIG. 8 in accordance with one embodiment of the present invention.

FIG. 12 illustrates a motion control system 212 for controlling the process of rolling the dielectric film laminate 101 into a solid dielectric elastomer transducer roll 178 with the rolling machine 166. The scrub roller 168 portion of the rolling machine 166 has a radius $r_{scrub}$. The motion control system 212 may be any electronic processor or digital logic based programmable motion controller configured to control the velocity and direction of rotation of the scrub roller 168 and the velocity and direction of translation of the carrier plate 156 in accordance with the present invention. As previously discussed in connection with FIGS. 7D-G, the carrier plate 156 is advanced in direction 174 at velocity $V_{plate}$ while the scrub roller 168 is rotated in a counter direction 172 at velocity $V_{scrub}$. As the outer surface of the scrub roller 168 contacts the dielectric film laminate 101, the dielectric film laminate 101 begins to roll up to form the solid dielectric elastomer transducer roll 178. The solid dielectric elastomer transducer roll 178 grows in diameter until the carrier plate 156 reaches the end of stroke. As matching the speeds of the carrier plate 156 and the scrub roller 168 can improve the rolling process and excess speed on the carrier plate 156 can jam the solid dielectric elastomer transducer roll 178 under the scrub roller 168. On the other hand, if the solid dielectric elastomer transducer roll 178 is sticky and adheres to the scrub roller 168, excess velocity on the scrub roller 168 can lift the solid dielectric elastomer transducer roll 178 off the liner 154 and wrap it around the scrub roller 168. Each of these situations can result in damaging the solid dielectric elastomer transducer roll 178. Accordingly, the motion control system 212 may be programmed in accordance with the following considerations to provide various levels of control ranging from the simple to the complex.

By way of example, the motion control system 212 may be configured in various forms from a relatively simple control system to a more complex control system. In one embodiment, the control system 212 may be configured to match the velocity of the carrier plate 156 $V_{plate}$ in direction 174 and the velocity of the scrub roller 168 $V_{scrub}$ in direction 172 such that $|V_{plate}|=|V_{scrub}|$. In another embodiment, the motion control system 212 may be configured to account for the velocity of the transducer roll $V_{roll}$ in direction 214 as a new variable to compensate for the movement of the center of the solid dielectric elastomer transducer roll 178 as the diameter grows such that $|V_{plate}|-|V_{roll,\,x}|=|V_{scrub}|$. In yet another embodiment, the motion control system 212 may be configured to account for a stretch coefficient "k" to compensate for stretching of the dielectric film laminate 101 as it is peeled from the liner 154 such that $|V_{plate}|-|V_{roll,\,x}|=k|V_{scrub}|$. Finally, in another embodiment, the motion control system 212 may be configured to employ at least one sensor to sense force and provide a closed loop feedback mechanism to the motion control system 212.

The complexity of the various configurations of the motion control system 212 outlined above can be avoided if the solid dielectric elastomer transducer roll 178 does not stick to the scrub roller 168. In that case, the scrub roller 168 can be rotated quickly relative to the carrier plate 156 so that it always brushes the solid dielectric elastomer transducer roll 178 back, as illustrated below in FIG. 13.

Figure 13:
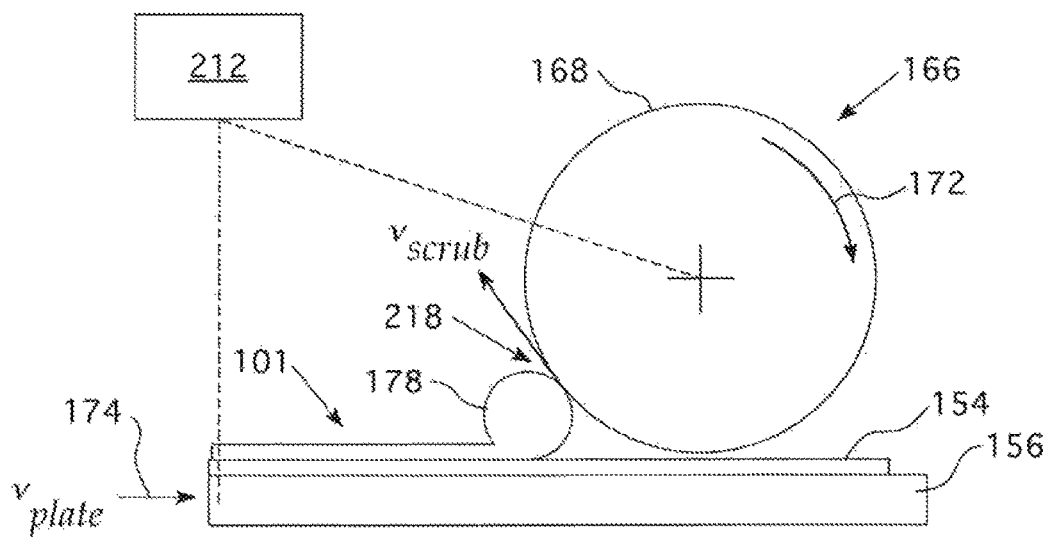
FIG. 13 illustrates a simplified motion control system for the rolling process illustrated in FIGS. 7D-F and FIG. 8 where slip can occur between the scrub roller and a growing solid dielectric elastomer transducer roll in accordance with one embodiment of the present invention.

FIG. 13 illustrates a simplified implementation of the motion control system 212 that is configured to account for slip 218 that can occur between the scrub roller 168 and the growing diameter of the solid dielectric elastomer transducer roll 178. Accordingly, the motion control system 212 may be configured to control the velocity of the carrier plate 156 $V_{plate}$ in direction 174 relative to the velocity of the scrub roller 168 $V_{scrub}$ in direction 172 such that $|V_{plate}|<<|V_{scrub}|$.

Figure 14:
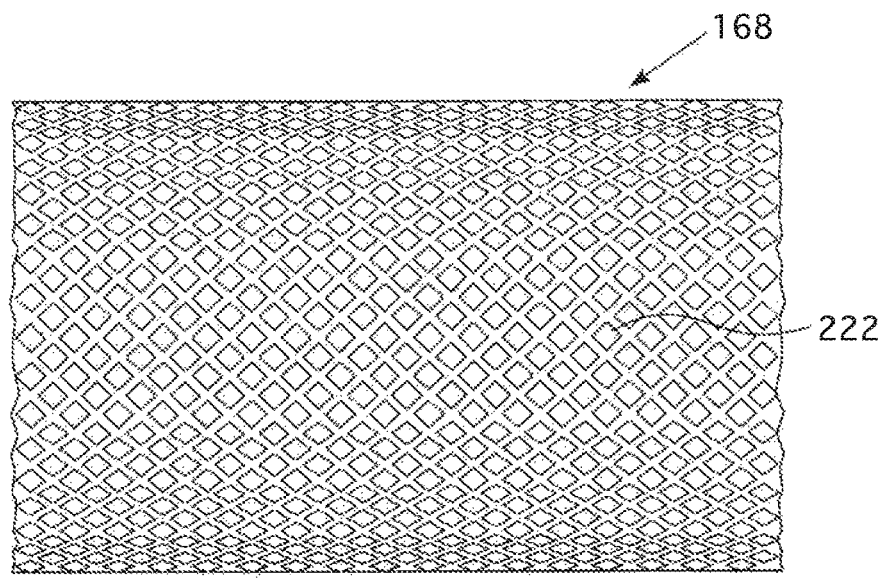
FIG. 14 illustrates a textile covering positioned over an outside surface of the scrub roller illustrated in FIG. 13 in accordance with one embodiment of the present invention.

FIG. 14 illustrates a textile covering 222 positioned over an outside surface of the scrub roller 168 illustrated in FIG. 13. The textile covering 222 is made of a non-stick material to provide non-stick contact between the scrub roller 168 and the solid dielectric elastomer transducer roll 178 in accordance with one embodiment of the present invention.

Figure 15:
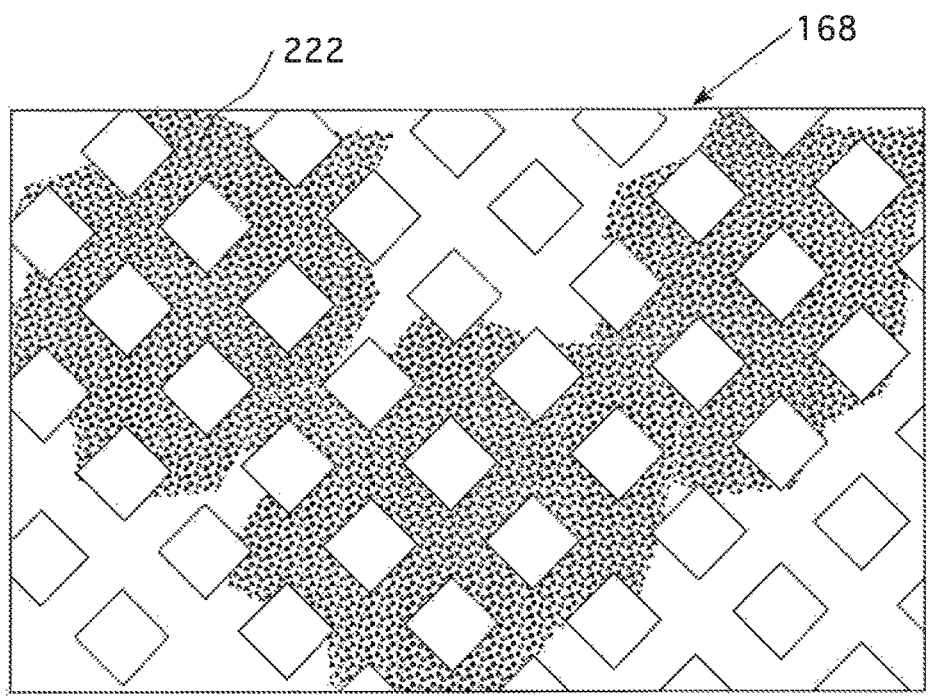
FIG. 15 is a detailed view of the textile covering illustrated in FIG. 14 in accordance with one embodiment of the present invention.

FIG. 15 is a detailed view of the textile covering 222 provided over the outside surface of the scrub roller 168 as illustrated in FIG. 14 in accordance with one embodiment of the present invention. With reference to FIGS. 14 and 15, a suitable non-stick contact between the scrub roller 168 and the solid dielectric elastomer transducer roll 178 may be achieved by covering the scrub roller with a knit fabric 222. The knit fabric 222 minimizes the dielectric-to-roller contact area and thus minimizes the adhesion force. The knit fabric 222 insures that the contact area is primarily empty air. Because the knit fibers can deflect, stress concentrations on the solid dielectric elastomer transducer roll 178 film are smaller than those provided by, for example, a roller made of a hard grooved plastic. This protects the solid dielectric elastomer transducer roll 178 from mechanical damage during the rolling process.

Figure 16:
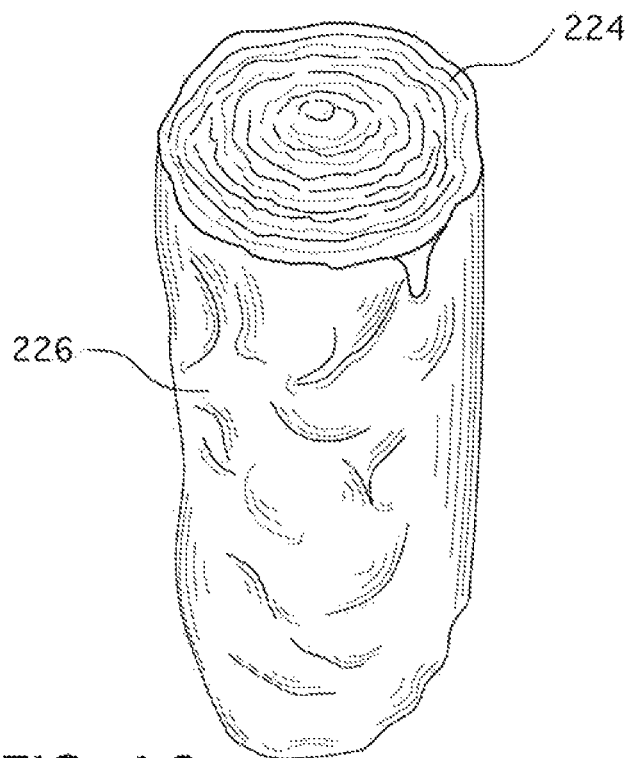
FIG. 16 illustrates circumferential lengthening of outer layers of solid dielectric elastomer transducer roll caused by rolling a pre-strained dielectric elastomer film with excessive pre-strain during the rolling process.

FIG. 16 illustrates circumferential lengthening of outer layers of the dielectric elastomer transducer roll 224 caused by rolling a pre-strained dielectric elastomer film with excessive pre-strain during the rolling process. An advantage of the rolling process according to one embodiment of present invention is the ability to apply a minimum of pre-strain to the dielectric elastomer transducer roll during the rolling process. In one aspect, the minimum pre-strain is only the pre-strain required for peeling the dielectric film laminate from the liner during the rolling process. This is useful because excessive pre-strain can cause relaxation of longitudinal pre-strain that can lead circumferential lengthening of the outer layers 226 of the transducer roll 224. As shown in FIG. 16, the outer layers 224 of the transducer roll 224 have delaminated in some places and not others, causing buckling. So, even if the inner layers of the transducer roll 224 do not buckle, the outer layers 224 may slip. This problem with pre-strain may be minimized by rolling up the unstrained dielectric film laminate directly from the liner on which it was coated in accordance with one embodiment of the present invention.

Figure 17:
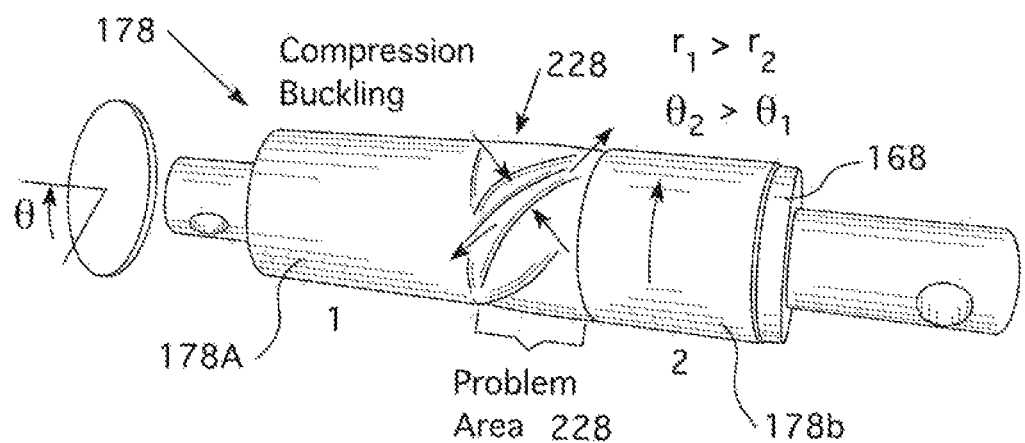
FIG. 17 illustrates a wrinkle mechanism in the loosely packed space between individual solid dielectric elastomer transducer rolls in accordance with one embodiment of the present invention.

FIG. 17 illustrates a wrinkling mechanism in the loosely packed space between individual electroded solid dielectric elastomer transducer rolls 178a, 178b in accordance with one embodiment of the present invention. The bands 226 of un-electroded film in between electroded solid dielectric elastomer transducer rolls 178a, 178b can cause rolling problems. The dielectric layers in these bands 226 are supported only loosely by underlying layers, and can therefore buckle 228 in response to non-uniform rotation along the length of the roll 168. This is illustrated in FIG. 17, where the electroded solid dielectric elastomer transducer rolls 178a, 178b have undergone slightly different rotation relative to the rotation rates of the band 226 therebetween. The electroded solid dielectric elastomer transducer rolls 178a, 178b portions of the transducer roll 178 are supported by the electrodes whereas the band 226 therebetween is unsupported and can buckle. The force of peeling the laminate film from the liner can also produce V-shaped wrinkles in these bands 226. The wrinkles propagate along the length of the roll as turns are added, which is undesirable. To minimize this problem, the regions of adjacent electroded solid dielectric elastomer transducer rolls 178a, 178b can be overlapped as described hereinbelow in FIG. 18.

Figure 18:
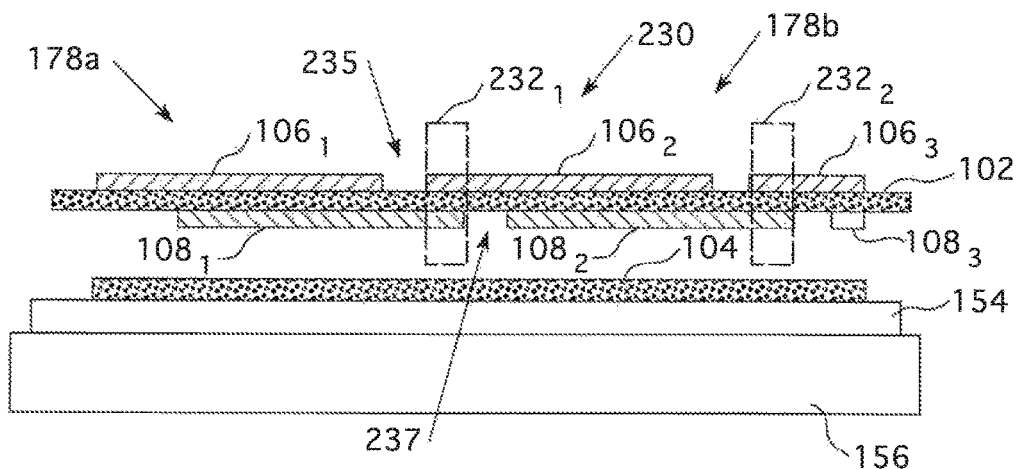
FIG. 18 illustrates an electrode pattern with overlap regions to provide support in bands between solid dielectric elastomer transducer rolls to prevent wrinkles that would otherwise start in the overlapping regions.

FIG. 18 illustrates an electrode pattern 230 with overlapping regions 232 to provide support in bands between adjacent (juxtaposed) layers of electrode materials to be segmented into individual solid dielectric elastomer transducer rolls 178a, 178b. The electrode pattern 230 prevents wrinkles that would otherwise start in the overlapping regions 232 and also enables segmenting the roll into individual solid dielectric elastomer transducer rolls 178a, 178b. The first dielectric film 102 is shown delaminated from the second dielectric film 104 for illustration purposes. As shown, the first and second electrodes 106, 108 are applied on opposite sides of the dielectric film 102 in a staggered (offset) manner to create overlapping regions 232. A first side of the dielectric film 102 includes multiple layers of electrode $106_1$, $106_2$, and $106_3$ material juxtaposed relative to each other and spaced apart by a gap 235 therebetween. A second side of the dielectric film 102 includes multiple layers of electrode $108_1$, $108_2$, and $108_3$ material juxtaposed relative to each other and spaced apart by a gap 237 therebetween. The layers of electrodes $106_1$, $106_2$, and $106_3$ on the first side of the dielectric film 102 are offset or staggered from the layers of electrodes $108_1$, $108_2$, $108_3$ on the second side of the dielectric film 102 to create the overlapping regions $232_1$, $232_2$ and so on. The second dielectric film 104 is still releasably attached to the liner 154 which is attached to the carrier plate 156. As previously discussed, the first dielectric film 102 with the electrodes $106_1$, $106_2$, $106_3$, $108_1$, $108_2$, and $108_3$ formed on each side thereof is laminated to the second dielectric film 104 on the liner 154.

Figure 19:
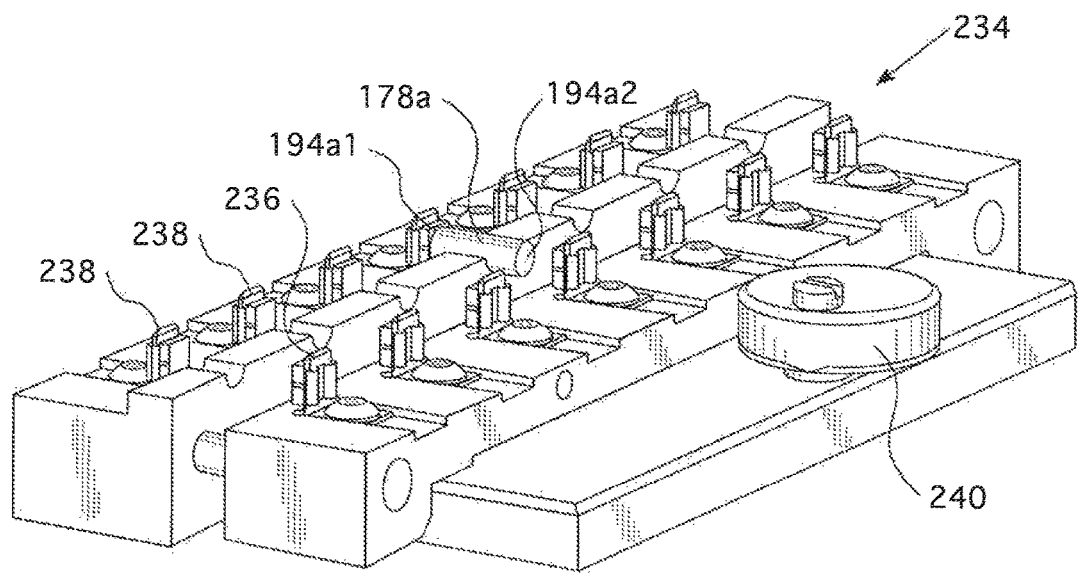
FIG. 19 illustrates a non-limiting example fixture for positioning electrical terminal caps on ends of a solid dielectric elastomer transducer roll during curing.

FIG. 19 illustrates a non-limiting example of fixture 234 for positioning the electrical terminal caps $194a_1$, $194a_2$ on ends of a solid dielectric elastomer transducer roll 178a during curing. The fixture 234 comprises a slot 236 to receive the solid dielectric elastomer transducer roll 178a and blade terminals 238 for receiving the electrical terminal caps $194a_1$, $194a_2$. As previously discussed in FIGS. 7I and 7J, the electrical terminal caps $194a_1$, $194a_2$ are filled with an electrically conductive adhesive 192. The ends of the solid dielectric elastomer transducer roll 178a are then inserted into each one of the conductive adhesive 192 filled electrical terminal caps $194a_1$, $194a_2$ and then a cam 240 is used to apply a clamping force to the assembled solid dielectric elastomer transducer roll 178a and conductive adhesive 192 filled electrical terminal caps $194a_1$, $194a_2$ during the curing process.

Having described embodiments of solid dielectric elastomer transducer rolls, methods for manufacturing the solid dielectric elastomer transducer rolls, and machines for manufacturing the solid dielectric elastomer transducer rolls, the specification now turns to a description of capacitance models for a solid dielectric elastomer transducer roll in axial tension and compression modes as well as radial (flat mode) compression modes.

Figure 20:
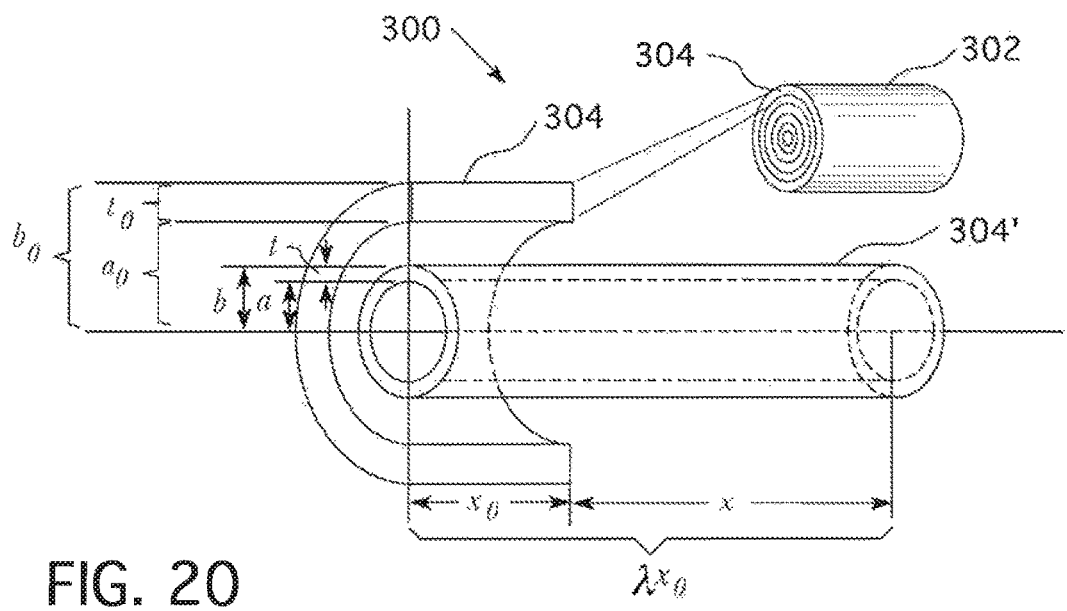
FIG. 20 illustrates a derivation model of a solid dielectric elastomer transducer roll in accordance with one embodiment of the present invention.

FIG. 20 illustrates a derivation model 300 of a solid dielectric elastomer transducer roll 302, similar to the solid dielectric elastomer transducer roll 100, 178 described above, in accordance with one embodiment of the present invention. The diagram depicted in FIG. 20 shows the solid dielectric elastomer transducer roll 302 in a relaxed state and also shows a comparison of an outer ring 304 of the solid dielectric elastomer transducer roll 302 in a relaxed state and the outer ring 304' when it is in tension. The solid dielectric elastomer transducer roll 302 has a length $x_0$ when the solid dielectric elastomer transducer roll 302 is not in tension and a length $(x_0+x)$ or $\lambda x_0$ when tensioned. The model assumes the spiral equivalent of N rings and the volume inside each ring is conserved due to the incompressibility of the rings within and the volume of the ring itself is conserved. Each ring is an annular capacitor and the total capacitance is the sum of the all N rings.

The main equations developed in accordance with the model are:

| | | |
|---|---|---|
| Effective Number of Rings in Roll | $N = \left(\dfrac{y_0}{t_0 \pi}\right)^{1/2}$ | Eq. 6 |
| Blocked Force | $F_{total} = V^2 \pi \varepsilon \varepsilon_0 \sum_{n=1}^{N} (\ln(n+1) - \ln(n))^{-1}$ | Eq. 7 |
| Spring Rate | $k = Y(y_0 + y_p) t_0 / (x_0 + x_p)$ | Eq. 8 |
| Free Stroke | $\Delta x \cong \dfrac{F_{total}}{k}$ | Eq. 9 |
| Roll Diameter | $D_{composite} = 2N(t_{film} + t_{elec})$ | Eq. 10 |

A Spiral is Equivalent to N Rings

The outer ring 304 of the un-tensioned solid dielectric elastomer transducer roll 302 has an outer radius $b_0$ that is equal to the N rings of thickness $t_0$:

$$b_0 = N t_0 \qquad \text{Eq. 11}$$

The area of the film is same whether it is laid out flat ($y_{0t}$) or rolled up into a circle ($\pi b^2_0$):

$$A_{film} = y_0 t \qquad \text{Eq. 12}$$
$$= \pi b_0^2$$

$$y_0 t_0 = \pi (N t_0)^2 \qquad \text{Eq. 13}$$

$$N t_0 = \left(\dfrac{y_0 t_0}{\pi}\right)^{1/2} \qquad \text{Eq. 14}$$

$$N = \left(\dfrac{y_0}{t_0 \pi}\right)^{1/2} \qquad \text{Eq. 15}$$

Volume Inside Each Ring is Conserved $$\text{Volume}_0 = \text{Volume}(\lambda) \qquad \text{Eq. 16}$$

$$\text{Volume}_0 = \pi a_0^2 x_0 \qquad \text{Eq. 17}$$

$$\text{Volume}(\lambda) = \pi a^2 \qquad \text{Eq. 18}$$

$$\pi a_0^2 x_0 = \pi a^2 \lambda x_0 \qquad \text{Eq. 19}$$

$$a_0^2 = a^2 \lambda \qquad \text{Eq. 20}$$

$$a^2 = \lambda^{-1} a_0^2 \qquad \text{Eq. 21}$$

$$a = \lambda^{-1/2} a_0 \qquad \text{Eq. 22}$$

Volume of Each Ring Itself is Conserved $$\text{Volume}_0 = \text{Volume}(\lambda) \qquad \text{Eq. 23}$$

$$\text{Volume}_0 = \pi(b_0^2 - a_0^2) x_0 \qquad \text{Eq. 24}$$

$$\text{Volume}(\lambda) = \pi(b^2 - a^2) \lambda x_0 \qquad \text{Eq. 25}$$

$$\pi(b_0^2 - a_0^2) x_0 = \pi(b^2 - a^2) \lambda x \qquad \text{Eq. 26}$$

$$(b_0^2 - a_0^2) = (b^2 - a^2) \lambda \qquad \text{Eq. 27}$$

$$b^2 = \lambda^{-1}(b_0^2 - a_0^2) + a^2 \qquad \text{Eq. 28}$$

$$b = (\lambda^{-1}(b_0^2 - a_0^2) + a^2)^{1/2} \qquad \text{Eq. 29}$$

Using the results from Eq. 22, this can be simplifies further:

$$b = (\lambda^{-1}(b_0^2 - a_0^2) + a^2)^{1/2} \qquad \text{Eq. 30}$$

$$b = (\lambda^{-1}(b_0^2 - a_0^2) + (\lambda^{-1/2} a_0)^2) \qquad \text{Eq. 31}$$

$$b = (\lambda^{-1}(b_0^2 - a_0^1) + \lambda^{-1} a_0^2)^{1/2} \qquad \text{Eq. 32}$$

$$b = (\lambda^{-1}(b_0^2 - a_0^2 + a_0^2))^{1/2} \qquad \text{Eq. 33}$$

$$b = (\lambda^{-1} b_0^2)^{1/2} \qquad \text{Eq. 34}$$

$$b = \lambda^{-1/2} b_0 \qquad \text{Eq. 35}$$

Capacitance of the Annular Capacitor

Initially the capacitance is:

$$C_0 = \dfrac{2 \pi \varepsilon \varepsilon_0 x_0}{\ln\left(\dfrac{b_0}{a_0}\right)} \qquad \text{Eq. 36}$$

After it has been stretched it becomes longer, so that the length becomes ($\lambda x_0$) and the radii (a and b) are no longer the initial radii ($a_0$ and $b_0$):

$$C(\lambda) = \dfrac{2 \pi \varepsilon \varepsilon_0 x_0 \lambda}{\ln\left(\dfrac{b}{a}\right)} \qquad \text{Eq. 37}$$

Substituting results from Eqs. 22 and 35 allows the stretched capacitance to be expressed in terms of initial geometry.

$$C(\lambda) = \dfrac{2 \pi \varepsilon \varepsilon_0 x_0 \lambda}{\ln\left(\dfrac{b}{a}\right)} \qquad \text{Eq. 38}$$

$$C(\lambda) = \dfrac{2 \pi \varepsilon \varepsilon_0 x_0 \lambda}{\ln\left(\dfrac{\lambda^{-1/2} b_0}{\lambda^{-1/2} a_0}\right)} \qquad \text{Eq. 39}$$

$$C(\lambda) = \dfrac{2 \pi \varepsilon \varepsilon_0 x_0}{\ln\left(\dfrac{b_0}{a_0}\right)} \lambda \qquad \text{Eq. 40}$$

Capacitance is expected to vary linearly with the stretch ratio. To get the force each ring provides note that electrostatic force depends on the change in capacitance with excursion from rest.

$$F_{elec} = V^2 \dfrac{\partial C}{\partial x} \qquad \text{Eq. 41}$$

Note that the stretch ratio can be expressed in terms of that excursion from rest.

$$\lambda = 1 + \dfrac{x}{x_0} \qquad \text{Eq. 42}$$

$$C(x) = \dfrac{2 \pi \varepsilon \varepsilon_0 x_0}{\ln\left(\dfrac{b_0}{a_0}\right)} \left(1 + \dfrac{x}{x_0}\right) \qquad \text{Eq. 43}$$

The derivative cancels out the initial length of the actuator ($x_0$). This means that the electric force will not be predicted to change as the length of the actuator changes.

$$\frac{\partial C}{\partial x} = \frac{2\pi\varepsilon\varepsilon_0 x_0}{x_0 \ln\left(\frac{b_0}{a_0}\right)} \qquad \text{Eq. 44}$$

$$\frac{\partial C}{\partial x} = \frac{2\pi\varepsilon\varepsilon_0}{\ln\left(\frac{b_0}{a_0}\right)} \qquad \text{Eq. 45}$$

$$F_{elec} = (1/2)V^2 \frac{\partial C}{\partial x} \qquad \text{Eq. 46}$$
$$= \frac{V^2 \pi\varepsilon\varepsilon_0}{\ln\left(\frac{b_0}{a_0}\right)}$$

Note that the outer radius $b_0$ is just the inner radius ($a_0$) plus the thickness of the film ($t_0$).

$$F_{elec} = (1/2)V^2 \frac{\partial C}{\partial x} \qquad \text{Eq. 47}$$
$$= \frac{V^2 \pi\varepsilon\varepsilon_0}{\ln\left(\frac{a_0 + t}{a_0}\right)}$$

To get the total force we must sum up the contributions of all N of the rings. Note that each ring has an outer radius that is one thickness greater than the inner radius.

$$F_{total} = V^2 \pi\varepsilon\varepsilon_0 \sum_{n=1}^{N} \left( \ln\left(\frac{(n+1)t_0}{nt_0}\right) \right)^{-1} \qquad \text{Eq. 48}$$

Canceling like terms $$F_{total} = V^2 \pi\varepsilon\varepsilon_0 \sum_{n=1}^{N} \left( \ln\left(\frac{(n+1)}{n}\right) \right)^{-1} \qquad \text{(Eq. 49)}$$

$$F_{total} = V^2 \pi\varepsilon\varepsilon_0 \sum_{n=1}^{N} (\ln(n+1) - \ln(n))^{-1} \qquad \text{(Eq. 50)}$$

The thickness of a layer has not, in fact disappeared. It appears in the upper limit of the series (N). The total number of layers (N) can be expressed simply in terms of the initial geometry.

$$F_{total} = V^2 \pi\varepsilon\varepsilon_0 \sum_{n=1}^{N} (\ln(n+1) - \ln(n))^{-1}, \qquad \text{Eq. 51}$$
where
$$N = \left(\frac{y_0}{t_0 \pi}\right)^{1/2}$$

The expected capacitance change is the force expression (Eq. 51) without the Voltage term ½$V^2$:

$$\frac{\partial C}{\partial x} = 2\pi\varepsilon\varepsilon_0 \sum_{n=1}^{N} (\ln(n+1) - \ln(n))^{-1}, \qquad \text{Eq. 52}$$
where
$$N = \left(\frac{y_0}{t_0 \pi}\right)^{1/2}$$

Both of the above are measurable. A candidate example geometry includes 48.8603 rings or approximately 49 rings. Accordingly, for approximately 49 rings, a predicted force and capacitance change rate is:

$$F_{elec} = \pi\varepsilon\varepsilon_0 V^2 \sum_{n=1}^{N} (\ln(n+1) - \ln(n))^{-1} \qquad \text{Eq. 53}$$

$$F_{elec} = \pi[2.85][8.854E - 12 \ F/m][1200V]^2 \sum_{n=1}^{49} (\ln(n+1) - \ln(n))^{-1} \qquad \text{Eq. 54}$$

$$\frac{\partial C}{\partial x} = \pi[2.85][8.854E - 12 \ F/m] \sum_{n=1}^{49} (\ln(n+1) - \ln(n))^{-1} \qquad \text{Eq. 55}$$

Figure 21:
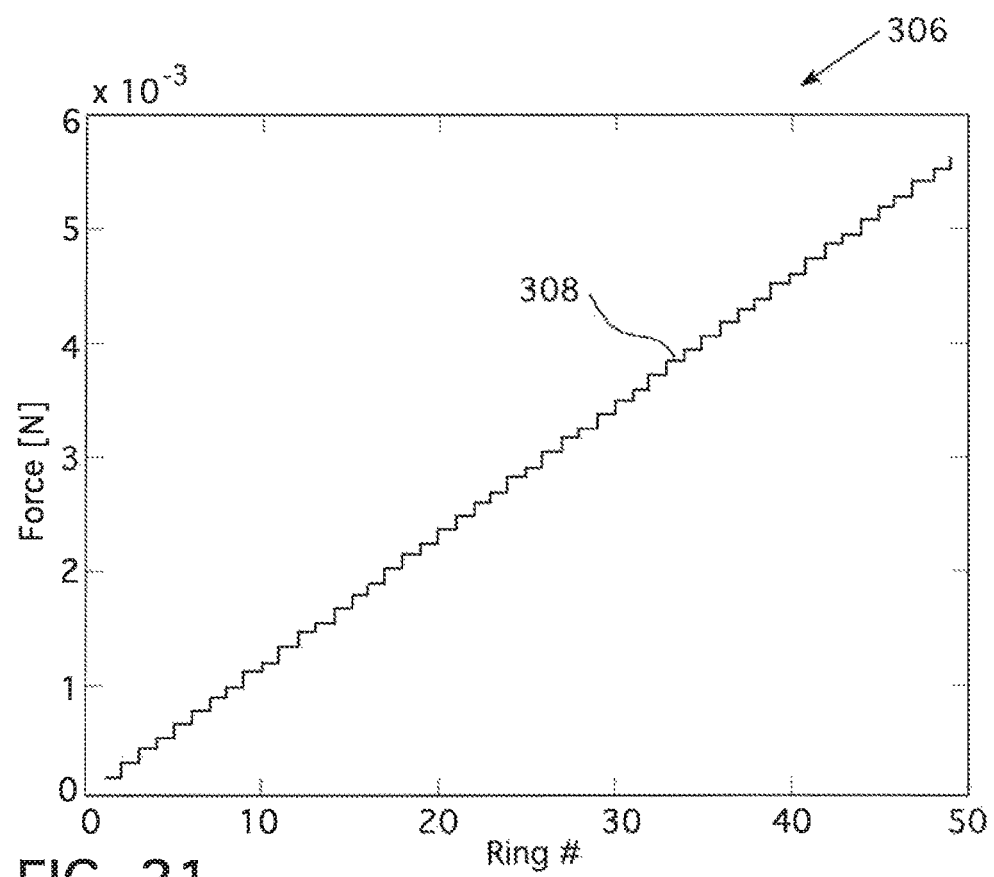
FIG. 21 is a graphical illustration depicting force provided by each additional ring in a solid dielectric elastomer transducer roll in accordance with one embodiment of the present invention.

FIG. 21 is a graphical illustration 306 depicting force 308 provided by each additional ring in a solid dielectric elastomer transducer roll in accordance with one embodiment of the present invention. Force [N] is shown along the vertical axis and ring number is shown along the horizontal axis. Accordingly, the additional force 308 provided by each ring grows linearly with the ring number. This is in conformity with expectations, as the area of each ring scales linearly with circumference. The total force of 0.1426 N approximately matches the total force for a model based on simpler assumptions: i.e., dielectric stacked, not rolled, (Eq. 56).

The calculation for parallel layers, not rolled up provides:

$$F_{elec} = (1/2)V^2 \frac{\partial C}{\partial x} \qquad \text{Eq. 56}$$
$$= (1/2)\frac{V^2 \varepsilon\varepsilon_0 y_i}{z_i}$$

Accordingly, the model provides a measurable prediction for capacitance change:

$dC/dx = Ftot/(0.5*(1200\textasciicircum 2)) = 1.9806e\text{-}007$ [F/m]

Figure 22:
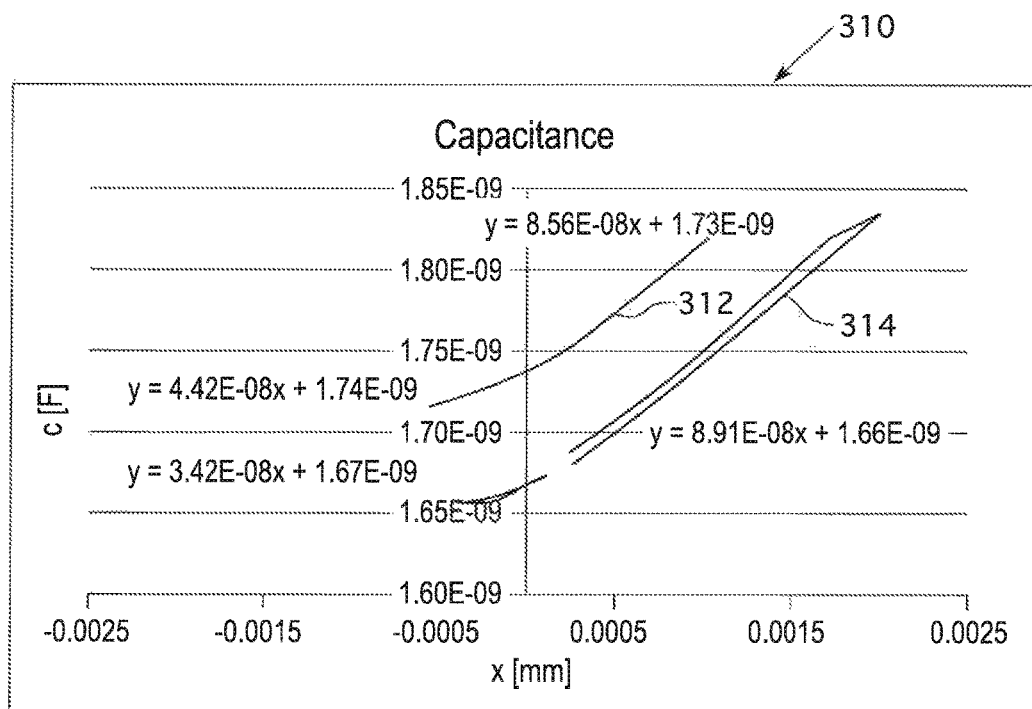
FIG. 22 is a graphical illustration depicting capacitance change versus axial displacement of a solid dielectric elastomer transducer roll in accordance with one embodiment of the present invention.

FIG. 22 is a graphical illustration 310 depicting capacitance change versus axial displacement of a solid dielectric elastomer transducer roll in accordance with one embodiment of the present invention. Capacitance C[F] is shown along the vertical axis and axial displacement x[mm] is shown along the horizontal axis.

The data substantially agrees with the model. In the graphical illustration 310 capacitance change in two solid dielectric elastomer transducer rolls with 10 mm active length are depicted by curves 312 and 14 mm total length are depicted by curves 314. A peak dC/dx of 8.91E-8 F/m was observed when the transducer rolls were in tension. Although this is just (8.9E-8/1.9806E-7)=44% of the expected dC/dx, the active area did not really experience all of the displacement. Some of the displacement was taken up by deformation in the passive 4 mm of the solid dielectric elastomer transducer roll. To estimate the effect that this compliance will have on measured dC/dx, two cases may be considered (1) negligible electrode stiffness and (2) a relatively large electrode stiffness, for example equal to the film stiffness.

Case 1—Electrode Negligible

Assuming that the active and passive areas have equal stiffness (that is, electrode is negligible), then the observed dC/dx is scaled by (total:active=14 mm:10 mm). The observed dC/dx is then (14/10)*([8.9E-8 F/m]/[1.9806E-7 F/m])=63% of expected.

Case 2—Electrode Stiff

If the stiffness of the electrode is not negligible, then it must be taken into account. In planar devices, it may be observed that a standard electrode coating on two sides of a film increases pseudo-DC stiffness of a film by an amount equivalent to multiplying Young's modulus of the film by two. The roll is comprised of two compliances in series. The active Area is 10 mm long and has two layers of electrode, and the passive 4 mm long and has one layer.

$$s1=0.010 \text{ m}/(2*Y\_film*Area)$$

$$s2=0.004 \text{ m}/(1.5*Y\_film*Area)$$

And the proportion of deformation occurring in the active area is $$\Delta x_1/\Delta x_{tot}=(5/(5+2.6667)=0.6522.$$

Scaling by this factor, dC/dx is found to be ((1/0.6522)*[8.9E-8 F/m])/[1.98E-7 F/m]=69% of expected. In the absence of control data measuring electrode stiffness directly, this provides the best estimate of how the observed capacitance change relates to the nested ring model.

Figure 23:
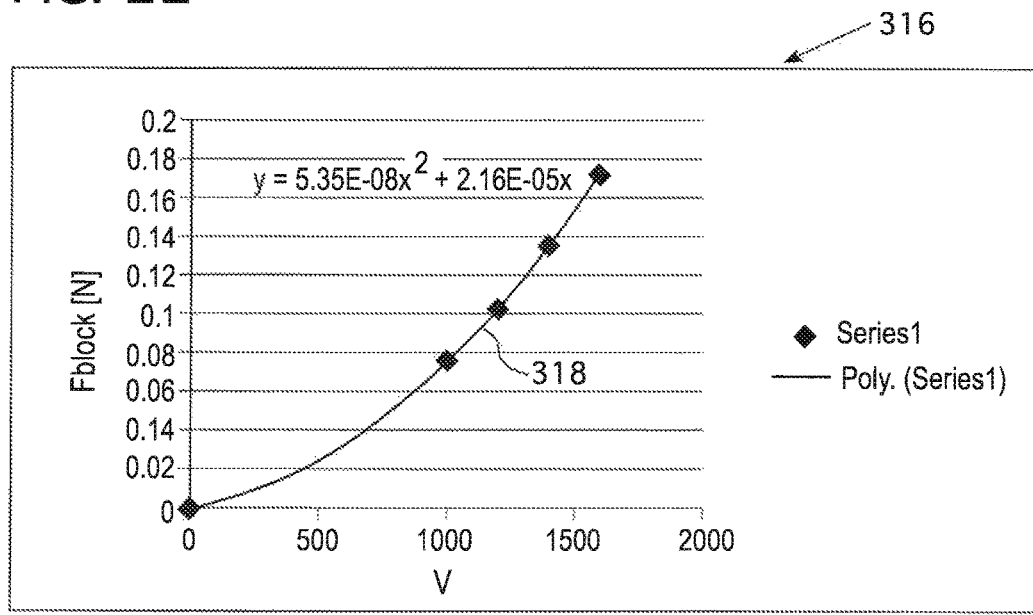
FIG. 23 is a graphical illustration depicting blocked force versus applied voltage response of a solid dielectric elastomer transducer roll in accordance with one embodiment of the present invention.

FIG. 23 is a graphical illustration 316 depicting blocked force versus applied voltage response 318 of a solid dielectric elastomer transducer roll in accordance with one embodiment of the present invention. The response 318 was obtained by measuring a sample on an INSTRON instrument for measuring tension/compression, made by INSTRON of Norwood, Mass., at 1200V and a blocked force at 1200V of 0.102N was observed, as shown in FIG. 23. The blocked force measurement is ([0.102 N]/[0.1363 N])=74% of the model prediction.

Figure 24:
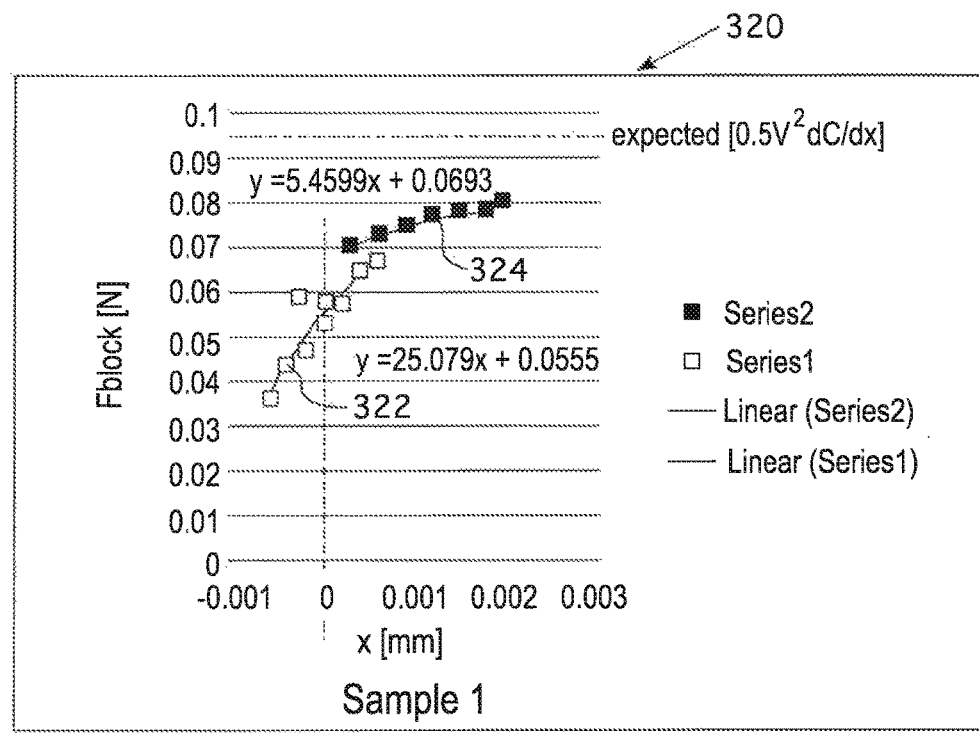
FIG. 24 is a graphical illustration depicting blocked force versus axial displacement showing the difference between the solid dielectric elastomer transducer roll in compression versus tension in accordance with one embodiment of the present invention.

FIG. 24 is a graphical illustration 320 depicting blocked force versus axial displacement demonstrating the difference between the solid dielectric elastomer transducer roll in compression versus tension in accordance with one embodiment of the present invention. Measuring blocked force on the INSTRON instrument, shows a clear difference between using the solid dielectric elastomer transducer roll in compression 322 versus tension 324, consistent with the slope differences observed in dC/dx. In compression, layers of the solid dielectric elastomer transducer roll undergo localized buckling rather than uniform compression. This occurs at forces (0.1 N) lower than the Euler buckling limit for the entire column (1.5N calculated, 1.4 N observed).

Figure 25:
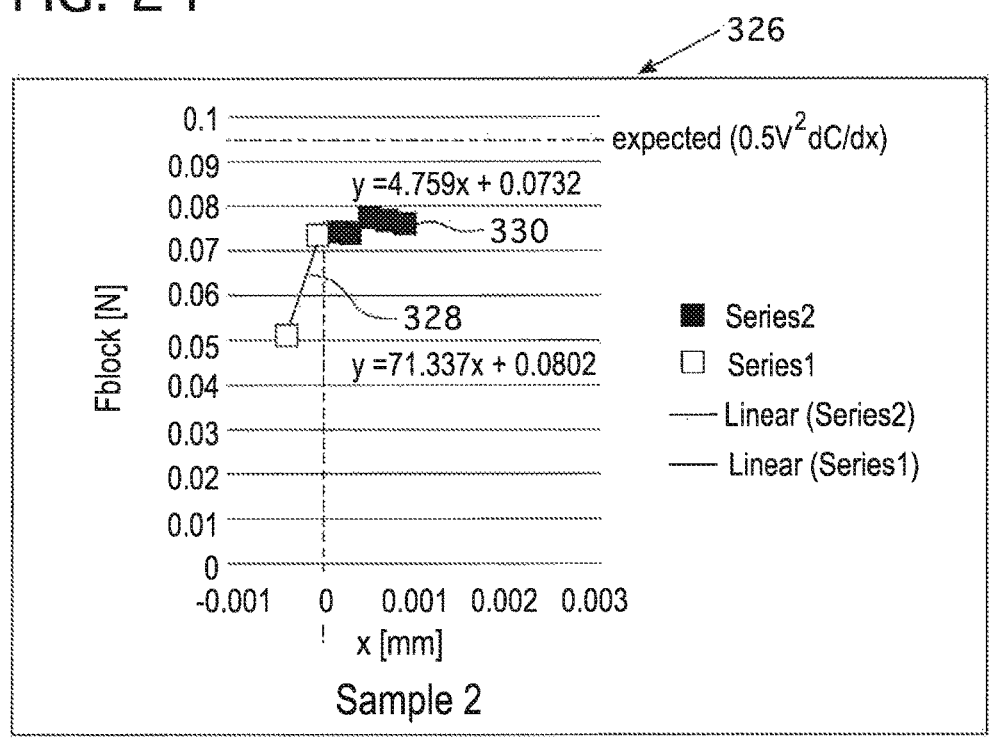
FIG. 25 is a graphical illustration of blocked force versus longitudinal displacement showing the difference between the solid dielectric elastomer transducer roll in compression versus tension in accordance with one embodiment of the present invention.

FIG. 25 is a graphical illustration 326 of blocked force versus longitudinal displacement showing the difference between the solid dielectric elastomer transducer roll in compression 328 versus tension 330 in accordance with one embodiment of the present invention.

Figure 26:
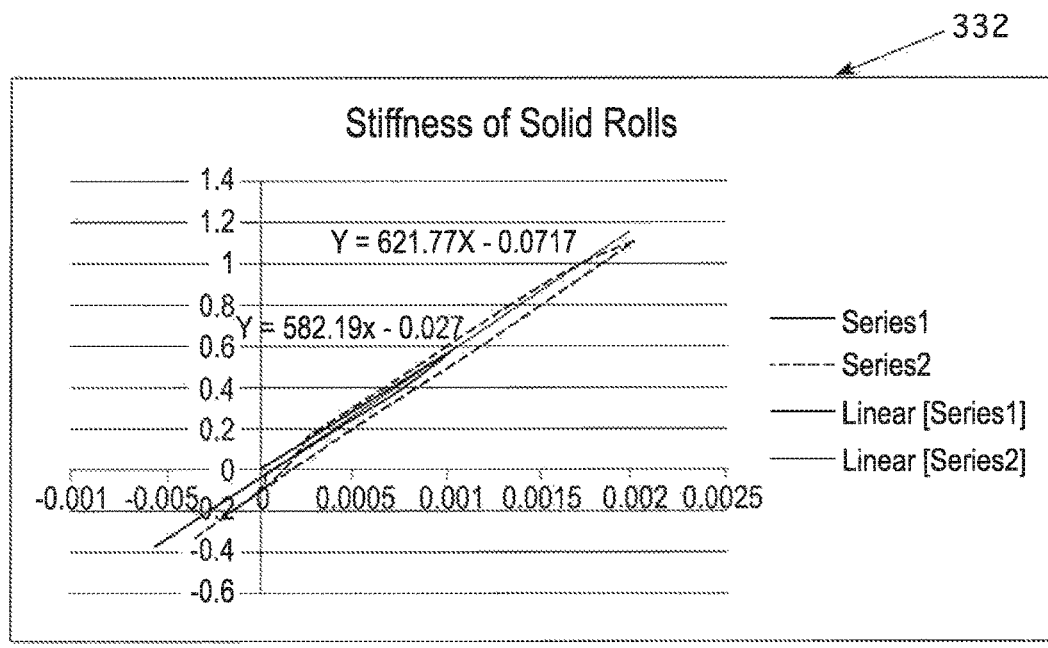
FIG. 26 is a graphical representation of stiffness of solid dielectric elastomer transducer rolls in accordance with one embodiment of the present invention.

FIG. 26 is a graphical representation 332 of stiffness of solid dielectric elastomer transducer rolls in accordance with one embodiment of the present invention. The simplest prediction of stiffness for the solid rolls is to neglect electrode stiffness and the rigid boundary conditions:

$$k_{simple}=YA/l=[0.6E6 \text{ Pa}]*([2*160E-3 \text{ m}]*[40E-6 \text{ m}])/[14E-3 \text{ m}]=548.6 \text{ N/m}.$$

This estimate of the stiffness is relatively good. Observed stiffness is higher than theoretical by only 6-13% in these two samples.

$$[582 \text{ N/m}, 621 \text{ N/m}]/[548.6 \text{ N/m}]=[1.06 \; 1.13]$$

This suggests that the effect of the electrode on the stiffness of the solid dielectric elastomer transducer rolls is relatively small and not the 2× factor in the active area that was considered in the dC/dx calculation above. It appears a better assumption may be to treat the electrode stiffness as negligible and to estimate that the observed dC/dx is about 63% of that expected by the model.

Figure 27:
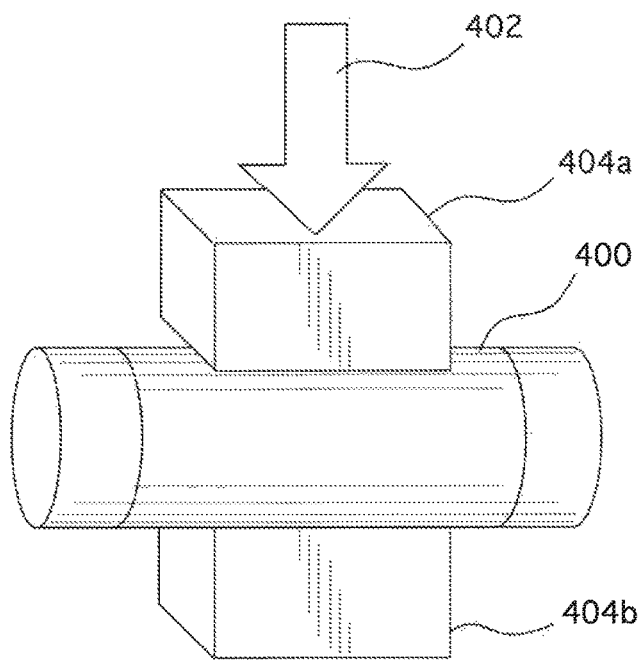
FIG. 27 illustrates a solid dielectric elastomer transducer roll in flat roll mode where the roll is placed under compression in a radial direction rather than in an axial direction in accordance with one embodiment of the present invention.

FIG. 27 illustrates a solid dielectric elastomer transducer roll 400 in flat roll mode where the roll 400 is placed under compression 402 in a radial direction rather than in an axial direction in accordance with one embodiment of the present invention. As shown, a portion of the solid dielectric elastomer transducer roll 400 is clamped between jaws 404a, 404b such that is compresses the transducer roll 400 radially rather axially. Experimental results indicate that the peak capacitance change dC/dx in radial ("flat roll") mode is approximately 5-times the capacitance change dC/dx in axial mode.

Figure 28:
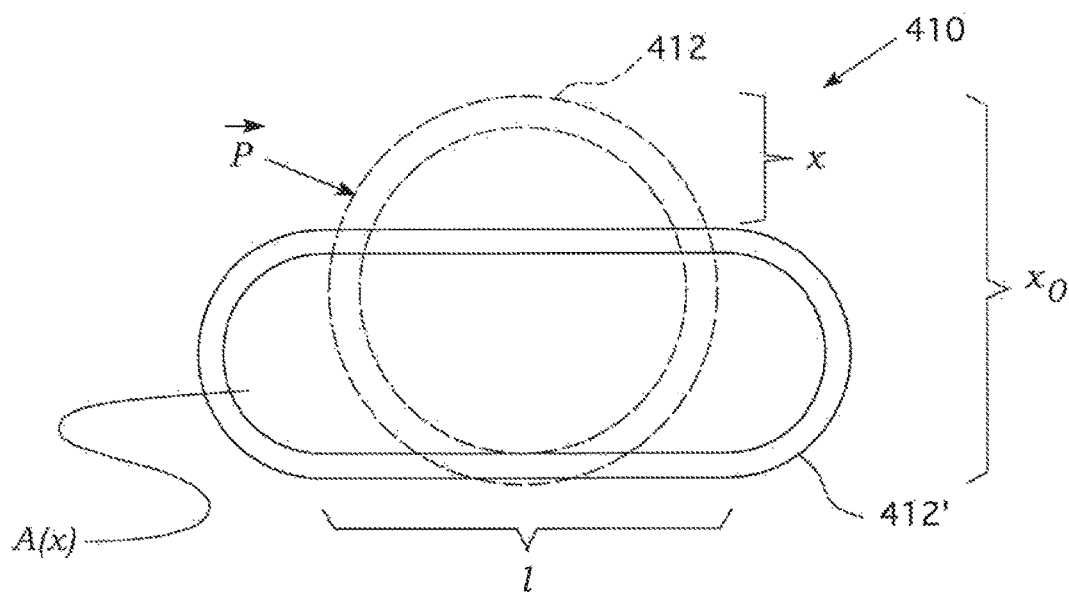
FIG. 28 illustrates a geometric model of a solid dielectric elastomer transducer roll in flat roll mode where the roll is placed under compression in a radial direction in accordance with one embodiment of the present invention.

FIG. 28 illustrates a geometric model 410 of a solid dielectric elastomer transducer roll 412 in radial ("flat roll") mode where the roll 412 is placed under compression in a radial direction in accordance with one embodiment of the present invention. The cross-sectional area of the uncompressed roll 412 is depicted as a circle in phantom, whereas the cross-sectional area A(x) of the roll 412' under radial compression is depicted in solid line as a flattened elongated structure with flat regions in the center over a length l and rounded ends. The model assumes the following:

Long out of plane→Plane strain;
Incompressible→A(x)=A₀; and
Flat regions slip→Equal strain around perimeter.

The geometric model for the solid dielectric elastomer transducer roll 412 in radial mode ("flat roll') is described by the following equations:

$$P_0 = \pi x_0 \quad \text{Eq. 57}$$

$$P(x) = 2\ell + \pi(x_0 - x) \quad \text{Eq. 58}$$

$$A_0 = \frac{\pi}{4}x_0^2 \quad \text{Eq. 59}$$

$$A(x) = \ell(x_0 - x) + \frac{\pi}{4}(x_0 - x)^2 \quad \text{Eq. 60}$$

$$A_0 = A(x) \quad \text{Eq. 61}$$

$$\frac{\pi}{4}x_0^2 = \ell(x_0 - x) + \frac{\pi}{4}(x_0 - x)^2 \quad \text{Eq. 62}$$

$$\ell = \frac{\pi(x_0^2 - (x_0 - x)^2)}{4(x_0 - x)} \quad \text{Eq. 63}$$

$$P(x) = 2\ell + \pi(x_0 - x) \quad \text{Eq. 64}$$

$$\lambda_P(x) = \frac{P(x)}{P_0} \quad \text{Eq. 65}$$

$$= \frac{P(x)}{\pi x_0}$$

$$C = C_0 \lambda_P^2 \quad \text{Eq. 66}$$

Figure 29:
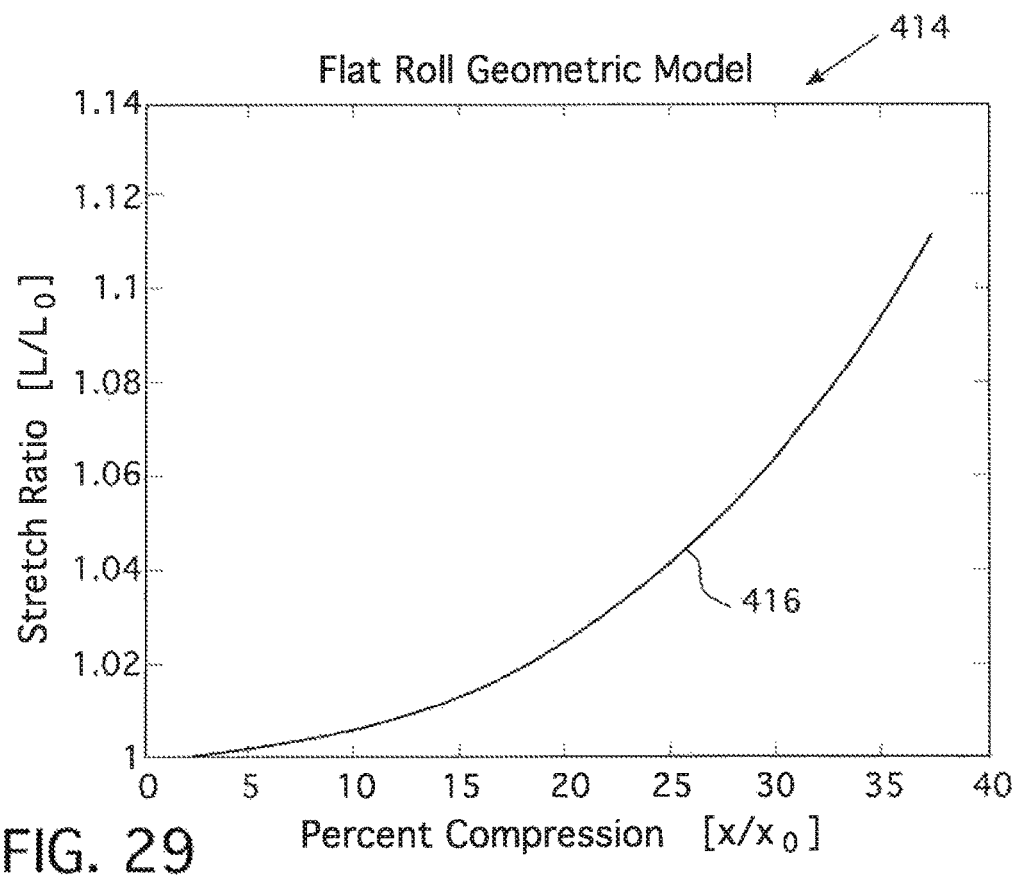
FIG. 29 is a graphical illustration depicting stretch ratio versus percent compression in a radial direction of a solid dielectric elastomer transducer roll in accordance with one embodiment of the present invention.

FIG. 29 is a graphical illustration 414 depicting stretch ratio versus percent compression in a radial direction of a solid dielectric elastomer transducer roll in accordance with one embodiment of the present invention. Stretch ration [L/L₀] is shown along the vertical axis and percent compression [x/x₀] is shown along the horizontal axis. The curve 416 shows non-linear behavior of stretch ration versus percent compression.

Figure 30:
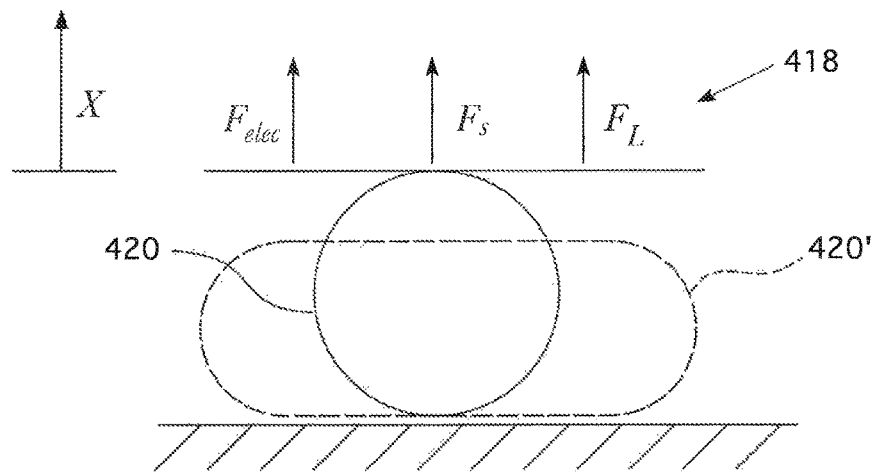
FIG. 30 illustrates a static equilibrium diagram of a solid dielectric elastomer transducer roll in flat roll mode under static load in accordance with one embodiment of the present invention.

FIG. 30 illustrates a static equilibrium diagram 418 of a solid dielectric elastomer transducer roll 420 in radial compression ("flat roll") mode under static load in accordance with one embodiment of the present invention. Static equilibrium is defined as follows:

$$F_{elec}+F_S+F_L=0 \quad \text{Eq. 67}$$

where $F_{elec}$ is electric force, $F_S$ is spring force and $F_L$ is an external load.

The electric force is proportional to the capacitance change dC/dx which is in turn proportional to the stretch ratio of the dielectric layers $\lambda = P/P_0$. Because this stretch is approximately quadratic with respect to compression of the roll, (FIGS. 29 and 31), the electric force, which is the slope of the capacitance curve, can be approximated with a single constant such that $dC/dx = k_1 x$. The spring force is also approximated well with a single term such that $F_s = k_3 x^2$ $$\tfrac{1}{2} V^2 (k_1 x) + k_3 x^2 + F_L = 0 \qquad \text{Eq. 68}$$

$$k_1 V^2 / 2 x + k_3 x^2 + F_L = 0 \qquad \text{Eq. 69}$$

$$k_3 x^2 + (\tfrac{1}{2} k_1 V^2) x + F_L = 0 \qquad \text{Eq. 70}$$

The equilibrium displacement of the roll subjected to the static load is found from the roots of the quadratic equation, where $a = k_3$, $b = \tfrac{1}{2} k_1 V^2$ and $c = F_L$.

$$x = [-b \pm \sqrt{(b^2 - 4ac)}] / 2a \qquad \text{Eq. 71}$$

The Pseudo-DC Roll Model $$F_{elec} = \tfrac{1}{2} V^2 dC/dx \qquad \text{Eq. 72}$$

$$F_{elec} = \tfrac{1}{2} V^2 (k_1 x) \qquad \text{Eq. 73}$$

$$F_S = k_3 x^2 \qquad \text{Eq. 74}$$

$F_L = -4$, [N], for example.

Figure 31:
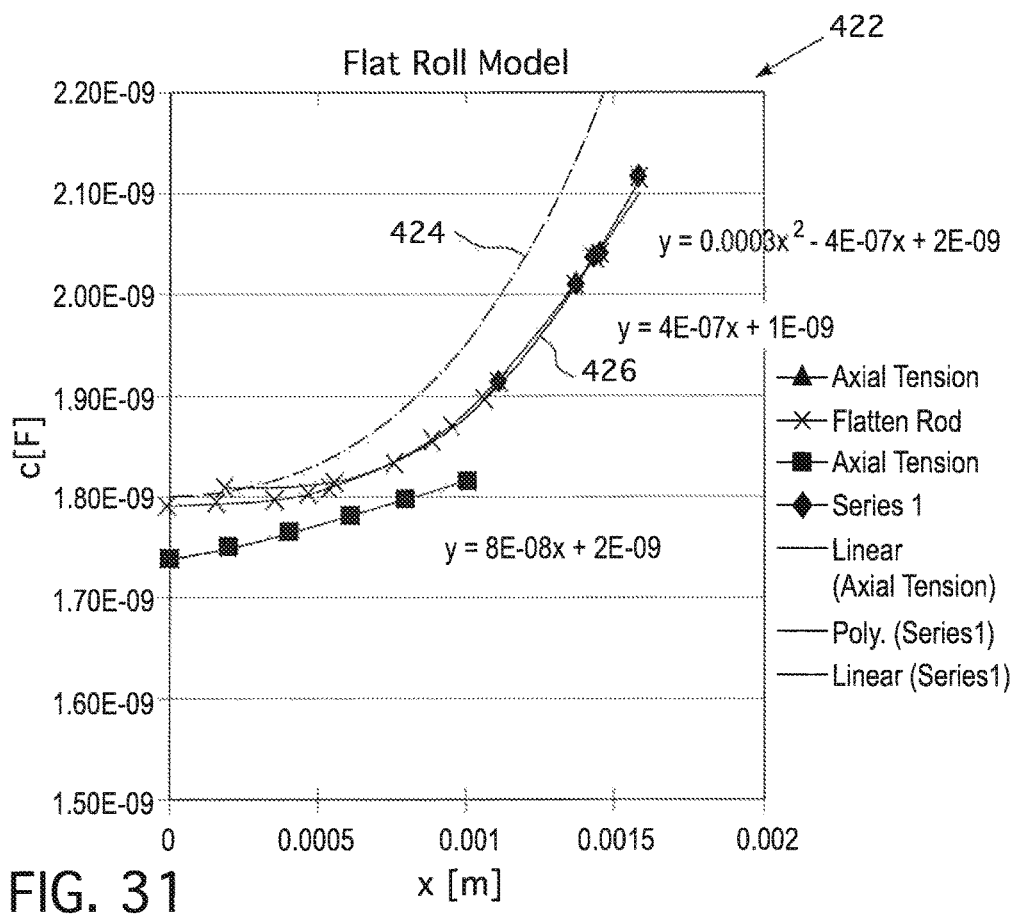
FIG. 31 is a graphical illustration depicting capacitance versus compression in a radial direction of a solid dielectric elastomer transducer roll in flat roll mode in accordance with one embodiment of the present invention.
Figure 32:
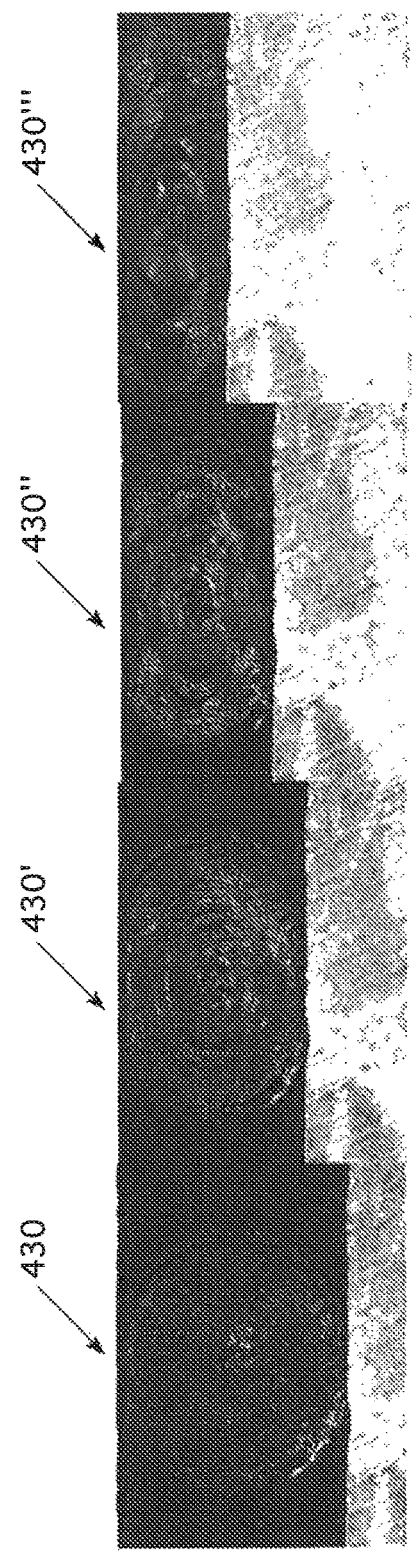
FIGS. 32A, 32B, 32C and 32D illustrate a solid dielectric elastomer transducer roll under increasing compression force in a radial direction in accordance with one embodiment of the present invention.

FIG. 31 is a graphical illustration 422 depicting capacitance versus compression in a radial direction of a solid dielectric elastomer transducer roll in flat roll mode in accordance with one embodiment of the present invention. Capacitance C[F] is shown along the vertical axis and compression x[m] is shown along the horizontal axis. The flat roll model curve 424 provides a reasonable first approximation of the capacitance change versus compression as compared to the measurements results 426. Potential contributors to the difference between actual measurements 426 and the model 424 may be that just 7.5 mm of 10 mm active length was compressed in an INSTRON test instrument and the rigid boundary may limit extension of the outer layers.

FIGS. 32A, 32B, 32C and 32D illustrate a solid dielectric elastomer transducer roll 430 under increasing compression force in a radial direction in accordance with one embodiment of the present invention. From left to right, the solid dielectric elastomer transducer roll 430 undergoes increasing compression force such that the roll 430 in under no compression force, roll 430' is under greater compression force than the roll 430, roll 430" is under greater compression force than the roll 430', and the roll 430''' is under greater compression force than the roll 430". As shown in FIGS. 32B, 32C and 32D, the roll begins to delaminate as it is subjected to increasing greater compression forces. This delamination causes deviation from the model, and presents a practical limit on compression of the roll.

Figures 33, 34:
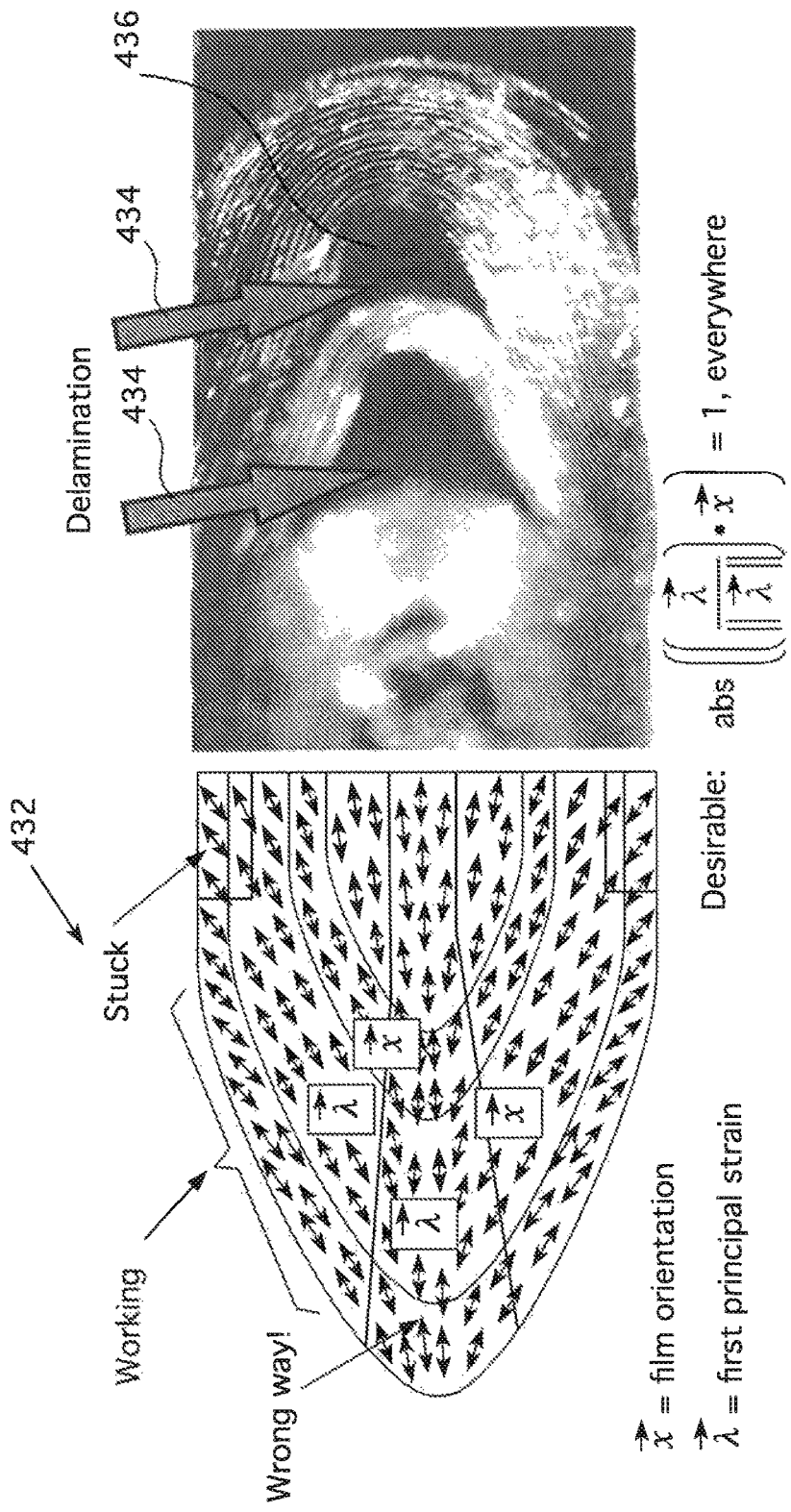
FIG. 33 illustrates a finite element analysis model of a solid dielectric elastomer transducer roll undergoing radial compression in accordance with one embodiment of the present invention.
FIG. 34 illustrates the delamination of a solid dielectric elastomer transducer roll undergoing radial compression in accordance with one embodiment of the present invention.

FIG. 33 illustrates a finite element analysis model 432 of a solid dielectric elastomer transducer roll 434 undergoing radial compression in accordance with one embodiment of the present invention and indicates where stretch orientation is and is not well-aligned with the orientation of the layers.

FIG. 34 illustrates the delamination of inner layers 434 of a solid dielectric elastomer transducer roll 436 undergoing radial compression in accordance with one embodiment of the present invention. As the finite element analysis predicts, delamination occurs in regions where the principal stretch is oriented through the thickness of dielectric films.

Figure 35:
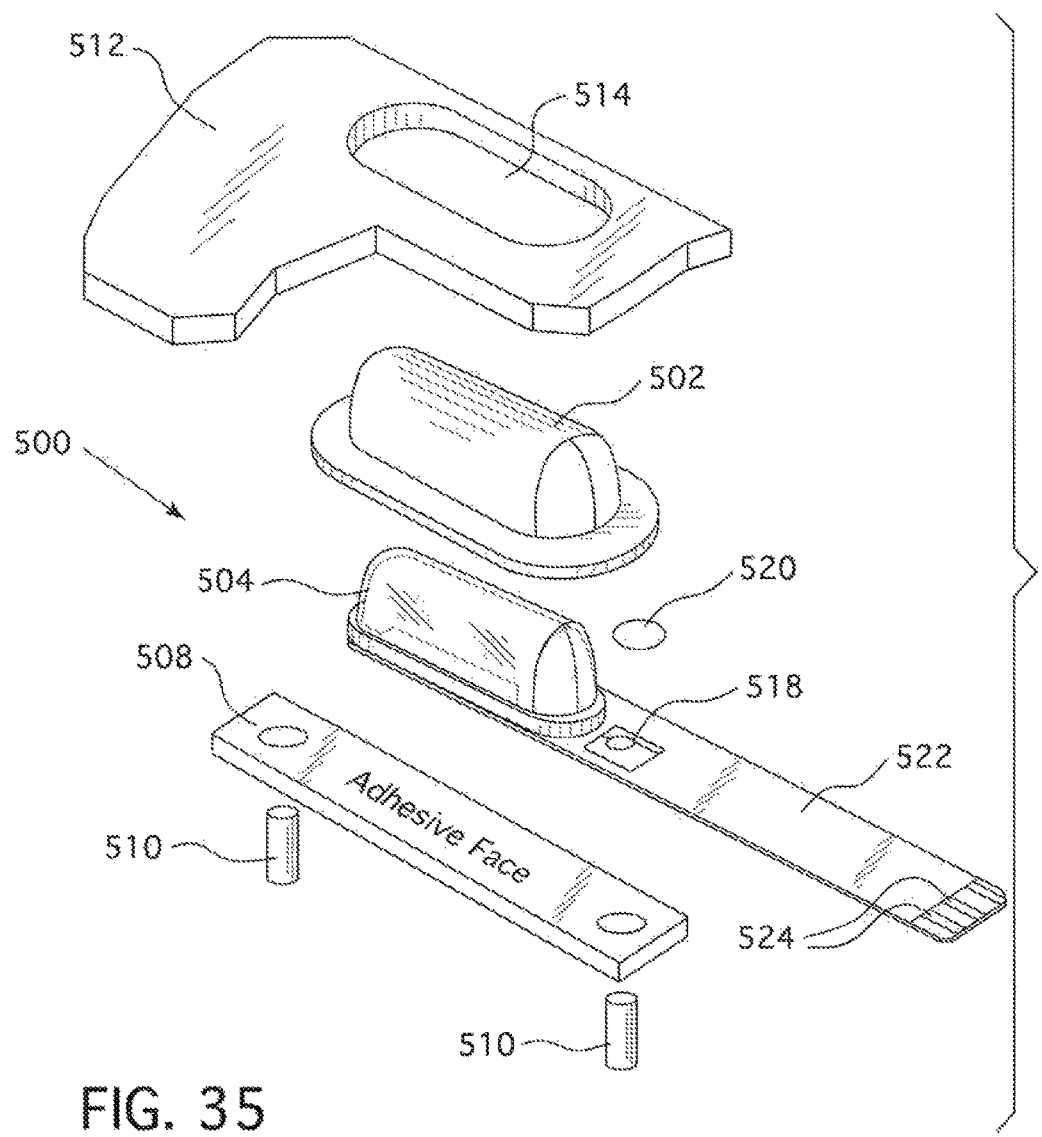
FIG. 35 illustrates an exploded view of a compliant actuator module configuration for a touch interface in accordance with one embodiment of the present invention.

FIG. 35 illustrates an exploded view of a compliant actuator module 500 configuration for a touch interface in accordance with one embodiment of the present invention.

The compliant actuator module 500 is packaged in a manner that is safe to touch. In the embodiment shown in FIG. 35, the compliant actuator module 500 is integrated with a case or housing 512 defining an aperture 514 to provide touch access to a portion of the compliant actuator module 500. In one embodiment, the compliant actuator module 500 comprises a compliant electrically conductive housing 502 and a solid dielectric elastomer transducer roll module 504 attached to a module support 508, which is specific to the case or housing in which the compliant actuator module 500 is integrated with. The module support 508 is configured to fixedly attach the substrate 506 to the housing 512. Optionally, the compliant actuator module 500 may comprise mounting fasteners 510. A portion of the compliant conductive housing 502 protrudes through an opening 514 defined in the housing 512 or housing of a device. The compliant conductive housing 502 is made of an electrically conductive material and is electrically connected to case ground (shield ground) at terminal 518 by an electrically conductive adhesive 520. In one embodiment, a flex connector 522 electrically couples the solid dielectric elastomer transducer roll module 504 to an electronic system through electrical contacts and/or traces 524. The configured to generate drive signals for the solid dielectric elastomer transducer roll 504.

Figure 36:
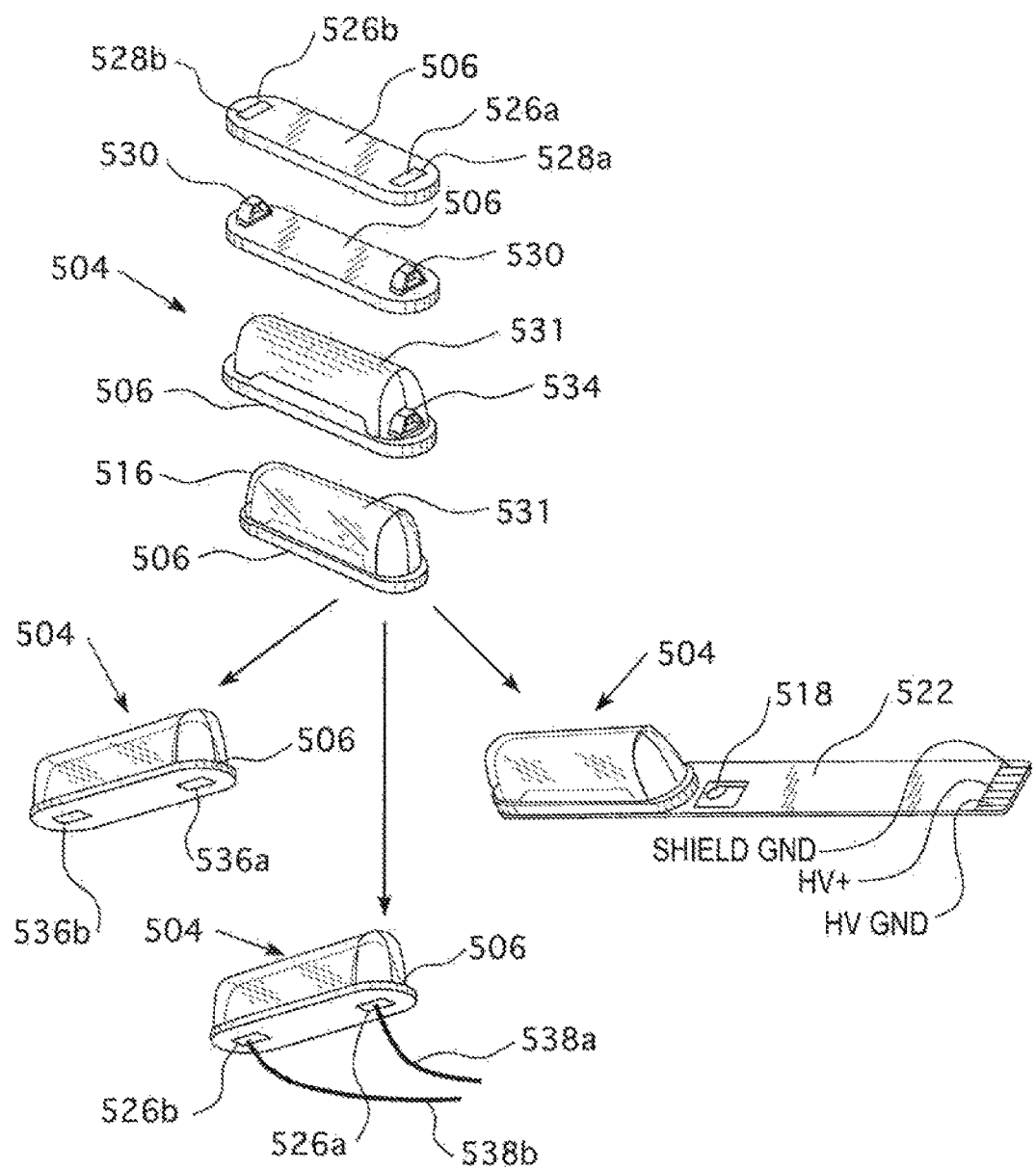
FIG. 36 illustrates an exploded view of the solid dielectric elastomer transducer roll module and various connection options in accordance with one embodiment of the present invention.

FIG. 36 illustrates an exploded view of the solid dielectric elastomer transducer roll module 504 and various connection options in accordance with one embodiment of the present invention. The solid dielectric elastomer transducer roll module 504 comprises a substrate 506 which includes holes 526a, 526b for injection molding and for wire termination. The substrate also includes electrically conductive terminals 528 that are suitable for soldering wires or for soldering surface mount technology (SMT) components thereto. The conductive terminals 528a, 528b are accessible above and below the substrate as discussed hereinbelow. SMT terminal points 530 are soldered to the conductive terminals 528a, 528b. A solid dielectric elastomer transducer roll 531 is then attached to the substrate 506 and conductive silicone 534 is applied at the ends of the solid dielectric elastomer transducer roll 531, by insert molding or other techniques, to electrically couple the transducer roll 534 to the terminal points 530 and the conductive terminals 528a, 528b. An electrically insulative silicone coating 516 is applied to the exterior surface of the transducer roll 534, by insert molding, or other techniques. The electrically insulative silicone coating 516 is interposed between the transducer roll 534 and the compliant electrically conductive housing 502.

There are various options for providing electrical connections to the solid dielectric elastomer transducer roll module 504. One option includes attaching the flex circuit 522 to the transducer module 504 via SMT conductive terminals 536a, 536b provided underneath the substrate 506. The conductive terminals of the flex circuit 522 are coupled to a high voltage driver circuit. The SMT conductive terminals 536a, 536b on the bottom layer of the substrate 506 are electrically coupled to the SMT conductive terminals 528a, 528b on the top layer of the substrate 506. The bottom SMT conductive terminals 536a, 536b may be used to attach the transducer roll module 504 to other substrates and/or external devices. Alternatively, the transducer roll module 504 may be electrically coupled by electrical wires 538a, 538b attached through conductive via through-holes 526a, 526b through the substrate 506. The high voltage positive (HV+) lead wire 538a is connected to the positive terminal of a high voltage drive circuit and the high voltage ground (HV GND) lead wire 538b is connected to the ground terminal of the high voltage drive circuit. Housing ground (SHIELD GND) is connected to terminal 518. Alternatively, the transducer roll module 504a may be electrically connected to other systems and/or substrates by way of quick-connect interconnects such as those described in commonly owned PCT International Patent Application PCT/US 13/55304, which is hereby incorporated by reference in its entirety.

Figure 37:
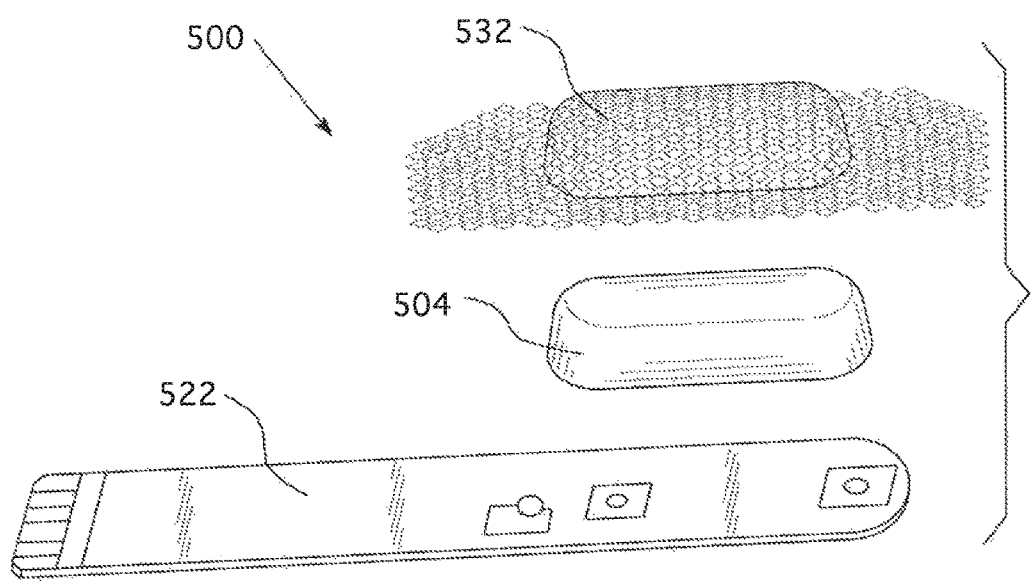
FIG. 37 is an exploded view of the compliant actuator module shown in FIG. 35 configured to electrically mount to a flex circuit in accordance with one embodiment of the present invention.
Figure 38:
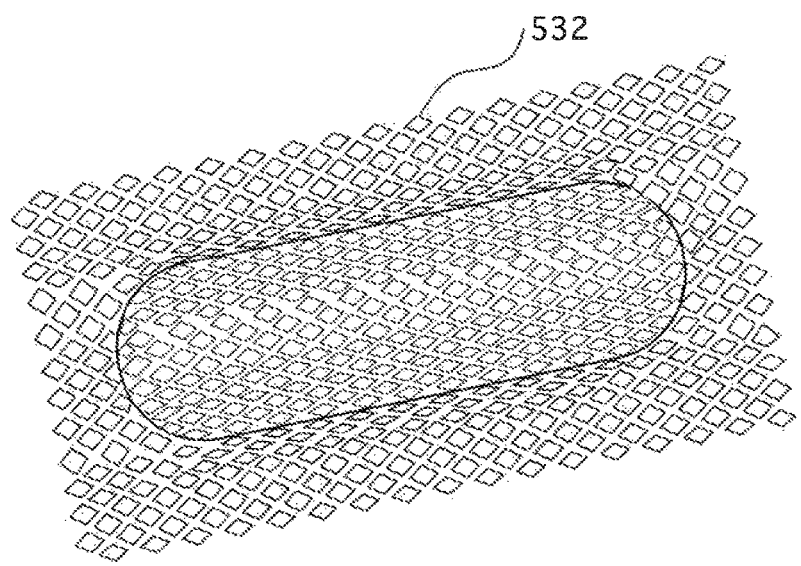
FIG. 38 illustrates a bottom perspective view of the electrical shield in accordance with one embodiment of the present invention.
Figure 39:
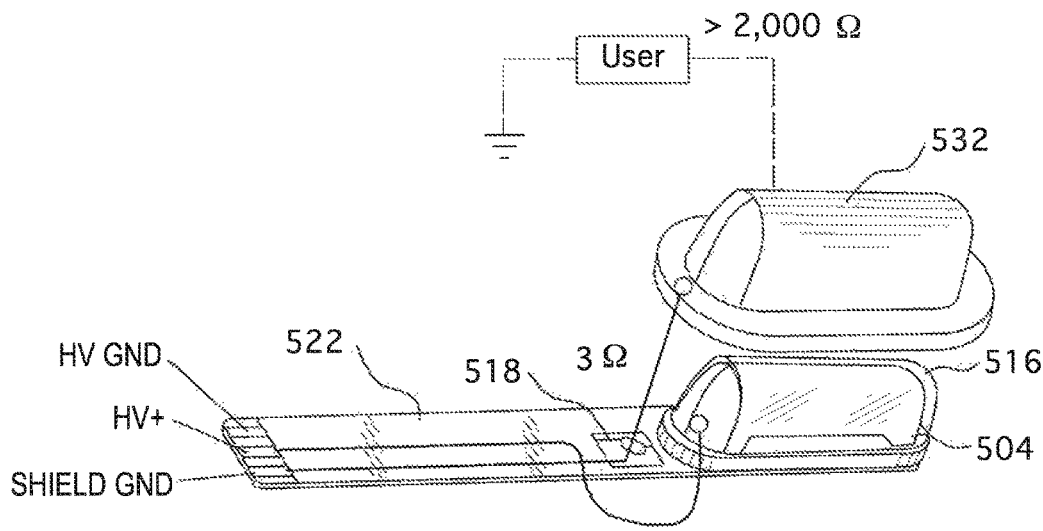
FIG. 39 illustrates a schematic diagram of the compliant actuator module electrical isolation feature making it electrically safe for a user to touch the actuator module with the fingertip in accordance with one embodiment of the present invention.

FIG. 37 is an exploded view of the compliant actuator module 500 shown in FIG. 35 configured to electrically mount to a flex circuit 522 in accordance with one embodiment of the present invention. The compliant actuator module 500 comprises a solid dielectric elastomer transducer roll module 504, an electrical shield 532, and a flex circuit 522. The electrical shield 532 provides electrical isolation and makes it electrically safe for a user to touch the actuator module 500 with the fingertip. FIG. 38 illustrates a bottom perspective view of the electrical shield 532 in accordance with one embodiment of the present invention. With reference to FIGS. 37 and 39, the illustrated embodiment of the electrical shield 532 is fabricated by laminating abrasion-resistant thermoplastic polyurethane (TPU) to an electrically conductive material such as metal plated fabric and vacuum forming it to make a stretchable or compliant conductive shield. The electrical shield 532 is soft to the touch with a low durometer (for example, Shore A 50-80) and can be configured as an active button for handsets, game controllers, and the like. In one embodiment, a $^{10}/_{1000}$"(10 mil) thick TPU allows the actuator sufficient freedom to move. In other embodiments, the electrically conductive fabric can be sandwiched between two thinner layers of TPU, for example, $^{5}/_{1000}$"(5 mil). Other structures can be used. The fabric can be embedded in a castable or moldable electrically insulative polymer or elastomeric matrix such as a rubber, polyurethane, silicone, olefin, fluoropolymer, styrenic copolymer, olefinic copolymer, or the like. Other flexible/stretchable conductive materials such as conductive polymers, conductive polymer composites or corrugated metal foil, can be used with or in lieu of the conductive fabric. The fabric can be produced by any method for producing textiles such as weaving, knitting, or felting.

FIG. 39 illustrates a schematic diagram of the compliant actuator module 500 electrical isolation feature making it electrically safe for a user to touch the actuator module 500 with the fingertip in accordance with one embodiment of the present invention. As shown the HV+ terminal on the flex circuit 522 is electrically coupled to the positive terminal (528a as shown in FIG. 36) of the solid dielectric elastomer transducer roll module 504. The SHIELD GND terminal of the flex circuit 522 is electrically coupled to the electrical shield 532 through the terminal 518. To connect the shield 532 to the terminal 518, a small portion of the conductive textile is exposed and soldered to the terminal 518. In the event a fault occurs, such as short circuit between the solid dielectric elastomer transducer roll module 504 and the shield 532 through the electrically insulative silicone coating 516, the shield provides a shunt path (~3Ω) to the SHIELD GND relative to a high impedance user resistance path (~2000Ω) to ground. Accordingly, any stray current is shunted to ground and the shunt current is isolated from the user with a layer of compliant insulation, such as for example, electrically insulative silicone coating 516. When the shunt is detected, a signal is provided to a ground fault circuit interrupter (GFCI) circuit breaker that shuts down the high voltage power supply to prevent the user from being shocked. A robust chain of electrical and mechanical connections are employed to couple the compliant actuator module 500 to rigid electronics.

Figure 40:
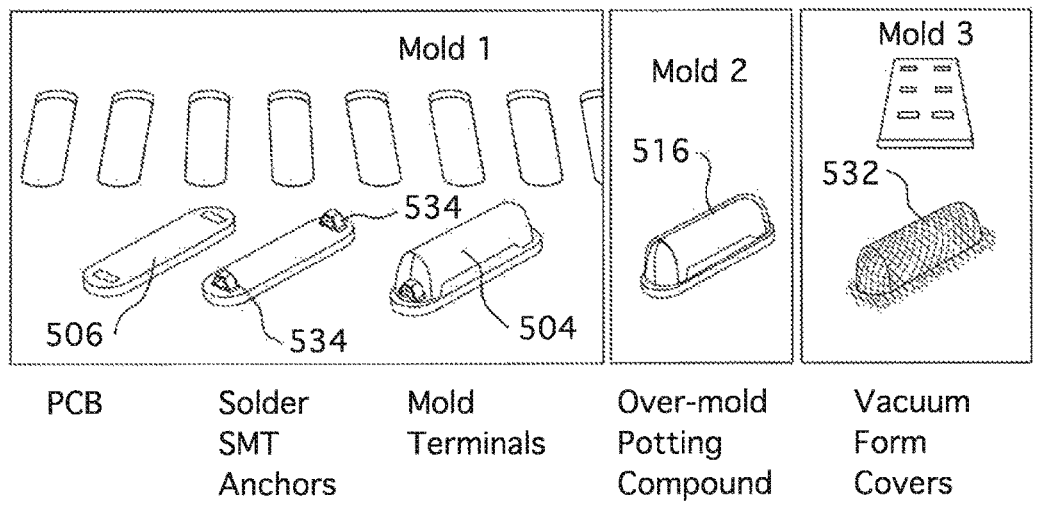
FIG. 40 illustrates a series of molding steps in the manufacturing process of a compliant actuator module in accordance with one embodiment of the present invention.

FIG. 40 illustrates a series of molding steps in the manufacturing process of a compliant actuator module 500 in accordance with one embodiment of the present invention. First, SMT anchors are soldered on a substrate 506 printed circuit board (PCB). A substrate 506 is provided in Mold 1, where the terminals are molded. The solid dielectric elastomer transducer roll module 504 is attached to the substrate 506. In Mold 2, a potting compound is over-molded over the solid dielectric elastomer transducer roll module 504 attached to the substrate 506. Shields 532 are vacuum formed in Mold 3.

Figure 41:
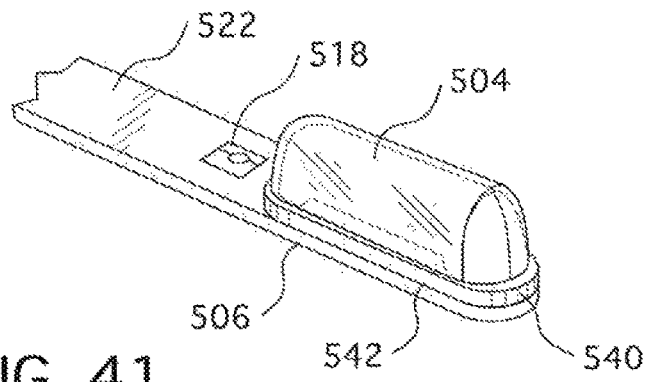
FIGS. 41-43 illustrate one method of assembling the shield laminate to the compliant actuator module in accordance with one embodiment of the present invention, where.
Figure 42:
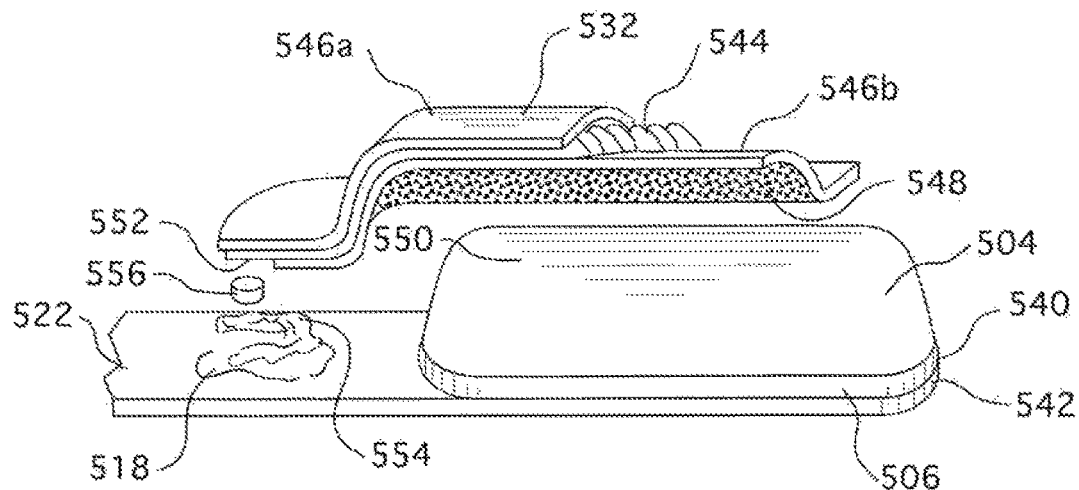
Figure 43:
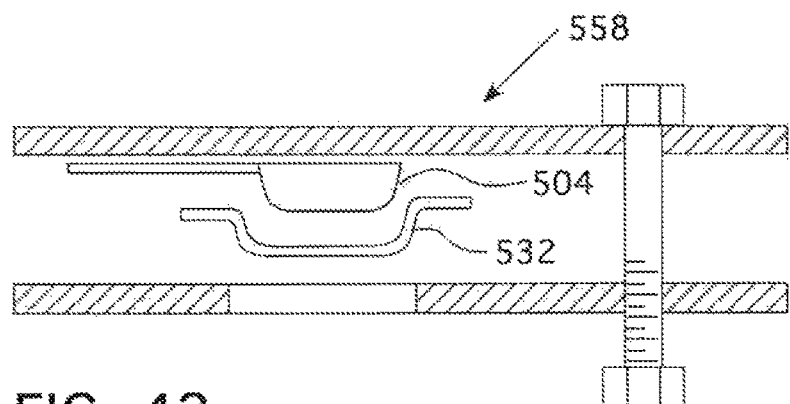

FIGS. 41-43 illustrate one method of assembling the shield 532 laminate to the compliant actuator module 500 in accordance with one embodiment of the present invention. FIG. 41 illustrates a solid dielectric elastomer transducer roll module 504 attached to a flex circuit 522 in accordance with one embodiment of the present invention. A flex seal 540 is attached with conductive adhesive at a seam 542 formed between the flex circuit 522 and the substrate 506. FIG. 42 illustrates a partial cut-away view of the shield 532 and the solid dielectric elastomer transducer roll module 504 attached to the flex circuit 522 in accordance with one embodiment of the present invention. FIG. 43 illustrates a compound mold 558 for molding the shield 532 onto the solid dielectric elastomer transducer roll module 504 to form the compliant actuator module 500 in accordance with one embodiment of the present invention.

With reference now to FIGS. 41-43, the shield 532 comprises a conductive knit fabric 544 laminated between first and second electrically insulative sheets 546a, 546b of polyurethane and/or TPU. A potting compound 548 is applied to the inside portion of the shield 532 to provide better adhesion to an outer surface 550 of the solid dielectric elastomer transducer roll module 504. A portion of the second urethane sheet 546b is removed to expose a portion 552 of the conductive knit fabric 544. A conductive weave 554 (e.g., copper) is attached to the solder pad 518 and a conductive adhesive 556 is applied over the conductive weave 554, which coincides with the exposed portion 552 of the conductive knit fabric 544. The shield 532 is then assembled with the solid dielectric elastomer transducer roll module 504 and the conductive adhesive 556 and the assembly is placed in a compound mold 558.

FIGS. 44-47 illustrate techniques for pre-straining circular solid dielectric elastomer transducer rolls 560 into a stack orientation in accordance with one embodiment of the present invention. FIGS. 44 and 45 illustrate a pulling technique in accordance with one embodiment of the present invention. A circular solid dielectric elastomer transducer roll 560 is placed in a pulling fixture 562 and a pulling force 563 is applied to the pulling fixture 562 in a direction towards a hard flat surface 564 over a vertical displacement of d. This creates a solid dielectric elastomer transducer roll 568 with a flat surface 566 on one side of the roll. The flat surface 566 enables two flatted circular solid dielectric elastomer transducer rolls 568 to be stacked together with the flat surfaces facing each other.

Figure 48:
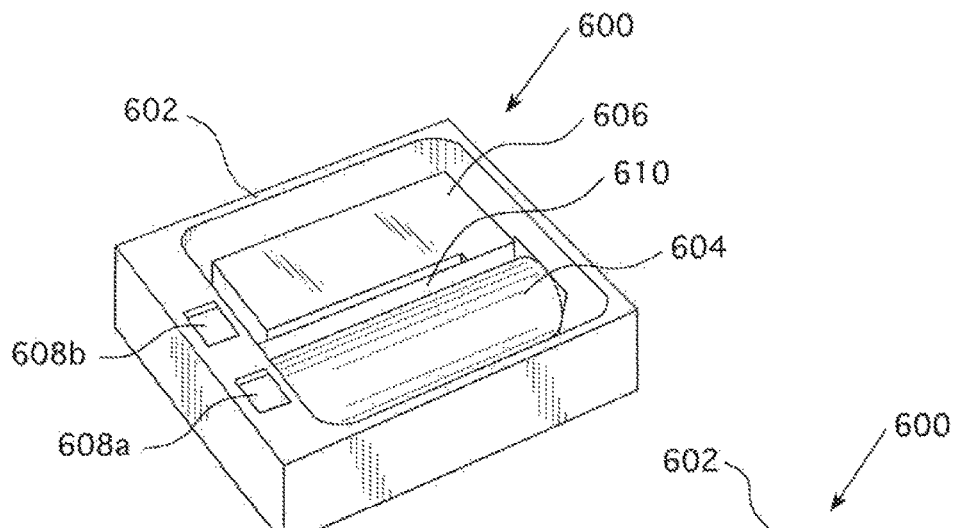
FIGS. 48-50 illustrate a cantilever beam inertial module for handheld devices in accordance with one embodiment of the present invention, where.
Figure 49:
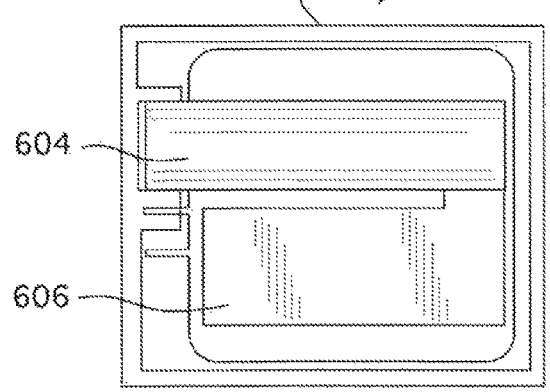
Figure 50:
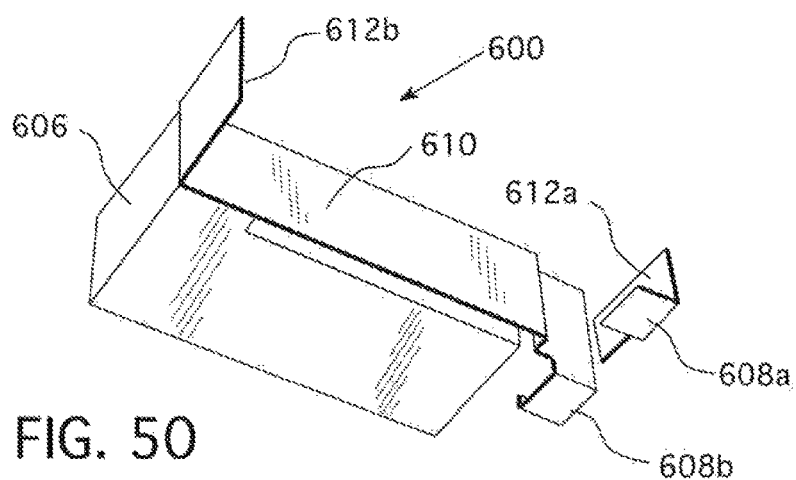

FIGS. 46 and 47 illustrate another pulling technique in accordance with one embodiment of the present invention. The circular solid dielectric elastomer transducer roll 560 is placed the pulling fixture 562 comprising an inclusion 570 that has a flat surface 572 on the side facing the circular solid dielectric elastomer transducer roll 560. The pulling force 563 is applied to the pulling fixture 562 in a direction towards the hard flat surface 564 over a vertical displacement of d', where d'>d. This creates a solid dielectric elastomer transducer roll 576 with flat surfaces 574a, 574b on both sides of the roll. The flat surfaces 574a, 574b enable two or more flatted circular solid dielectric elastomer transducer rolls 576 to be stacked together with the flat surfaces facing each other FIGS. 48-50 illustrate a cantilever beam inertial module 600 for handheld devices in accordance with one embodiment of the present invention. FIG. 49 illustrates a top view of the cantilever beam inertial module 600 in accordance with one embodiment of the present invention. The cantilever beam inertial module 600 comprises a housing 602, a cantilever mounted solid dielectric elastomer transducer roll 604, and a mass 606. One end of the solid dielectric elastomer transducer roll 604 is attached to the housing 602 and the other end is attached to the cantilevered mass 606. The other end of the mass 606 is free floating.

FIG. 49 illustrates a perspective bottom view of the cantilever beam inertial module 600. First and second conductive terminals 608a, 608b are provided on the housing 602 for making electrical contact with the solid dielectric elastomer transducer roll 604a. In one embodiment, the conductive terminals 608a, 608b are SMT compatible terminals. In other embodiments, the conductive terminals 608a, 608b may be configured as solder pads with holes or with connectors. The first conductive terminal 608a is electrically coupled to the near end of the solid dielectric elastomer transducer roll 604 and the second conductive terminal 608b is electrically coupled to a conductive strip 610, which provides an electrical connection to the far end of the solid dielectric elastomer transducer roll 604.

FIG. 50 illustrates a partial perspective view of the cantilever beam inertial module 600 showing the mass 606 attached to one end of the conductive strip 610 in accordance with one embodiment of the present invention. This can also be seen in FIG. 49. Conductive adhesive is provided to electrically couple the ends of the solid dielectric elastomer transducer roll 604 to terminals 612a, 612b.

Figure 51:
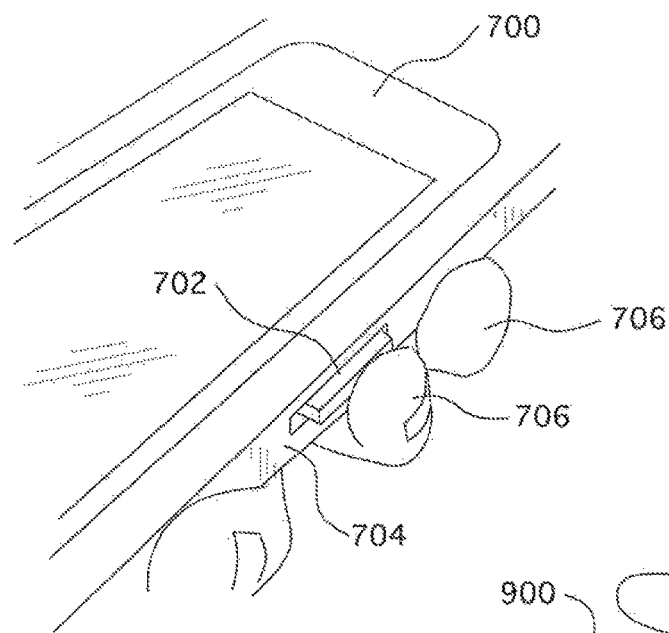
FIG. 51 illustrates a handheld device comprising a soft active button based on dielectric elastomer actuators described herein in accordance with one embodiment of the present invention.

FIG. 51 illustrates a handheld device 700 comprising a soft active button 702 based on dielectric elastomer actuators described herein in accordance with one embodiment of the present invention. The soft active button 702 is similar to the compliant actuator module 500 described hereinbefore. A portion of the soft active button 702 projects through the housing 704 of the handheld device 700. When the soft active button 702 is actuated, it can provide tactile feedback to the user 706 including custom button clicks and navigation cues. As previously discussed, an electrically conductive shield provides a touch interface that is electrically safe for the user 706 to touch with a fingertip 708.

Figure 52:
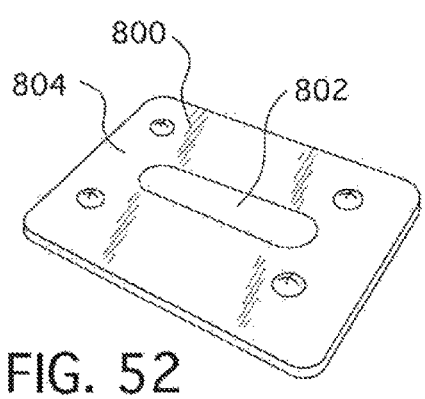
FIG. 52 illustrates a device comprising one or more soft active buttons based on dielectric elastomer actuators described herein in accordance with one embodiment of the present invention.

FIG. 52 illustrates a device 800 comprising one or more soft active buttons 802 based on dielectric elastomer actuators described herein in accordance with one embodiment of the present invention. The soft active buttons 802 are similar to the compliant actuator module 500 described hereinbefore. A portion of the soft active button 802 projects through the housing 804 of the handheld device 800. When the soft active button 802 is actuated, it can provide tactile feedback to the user including custom button clicks and navigation cues. As previously discussed, an electrically conductive shield provides a touch interface that is electrically safe for the user to touch with a fingertip.

Figure 53:
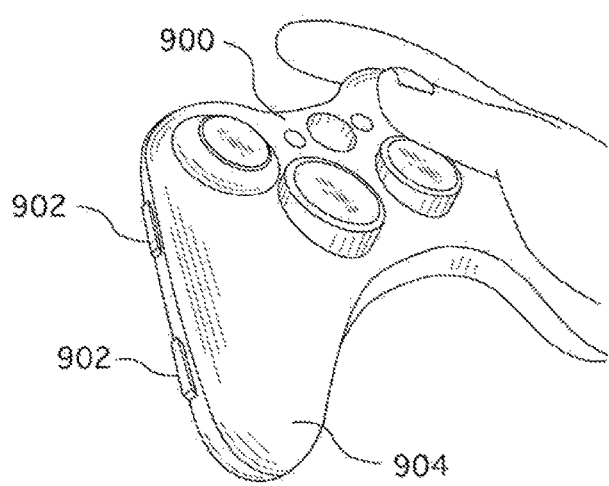
FIG. 53 illustrates a game console device comprising one or more soft active buttons based on dielectric elastomer actuators described herein in accordance with one embodiment of the present invention.

FIG. 53 illustrates a game console device 900 comprising one or more soft active buttons 902 based on dielectric elastomer actuators described herein in accordance with one embodiment of the present invention. The soft active buttons 902 are similar to the compliant actuator modules 500 described hereinbefore. A portion of the soft active button 902 projects through the housing 904 of the handheld device 900. When the soft active button 902 is actuated, it can provide tactile feedback to the user including custom button clicks and gaming cues. As previously discussed, an electrically conductive shield provides a touch interface that is electrically safe for the user to touch with a fingertip.

Figure 54:
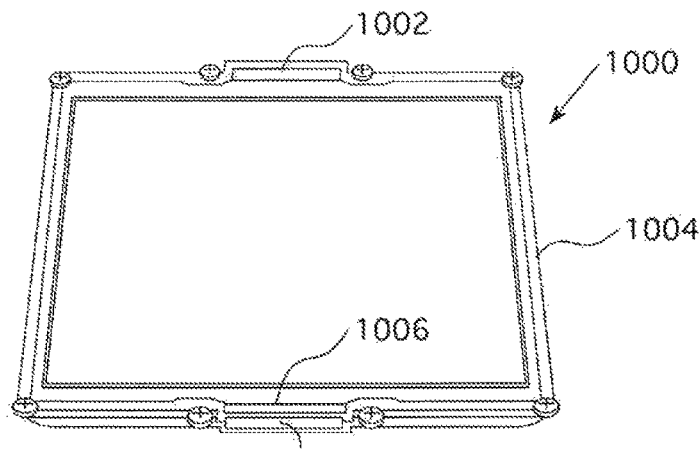
FIG. 54 illustrates a screen comprising one or more compliant actuator modules as described hereinbefore in accordance with one embodiment the present invention.

FIG. 54 illustrates a screen 1000 comprising one or more compliant actuator modules 1002 as described hereinbefore in accordance with one embodiment the present invention. The one or more compliant actuator modules 1002 are similar to the compliant actuator modules 500 described hereinbefore. The compliant actuator module 1002 is attached to a housing 1004 portion of the screen 1000 and provides tactile feedback. Blank-rolls or counter spring 1006 and shims 1008 may be included in the housing 1004 to enhance performance.

Figure 55:
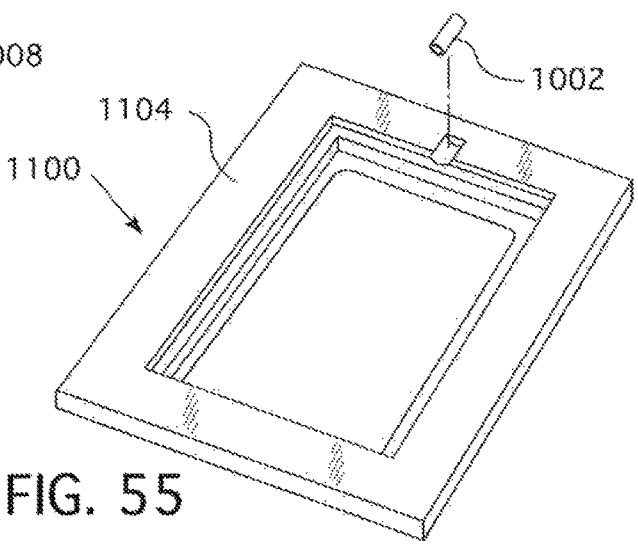
FIG. 55 illustrates another screen comprising one or more compliant actuator modules as described hereinbefore in accordance with one embodiment the present invention.

FIG. 55 illustrates another screen 1100 comprising one or more compliant actuator modules 1102 as described hereinbefore in accordance with one embodiment the present invention. The one or more compliant actuator modules 1002 are similar to the compliant actuator modules 500 described hereinbefore. The compliant actuator module 1002 is attached to a housing 1104 portion of the screen 1100 and provides tactile feedback.

Figure 56:
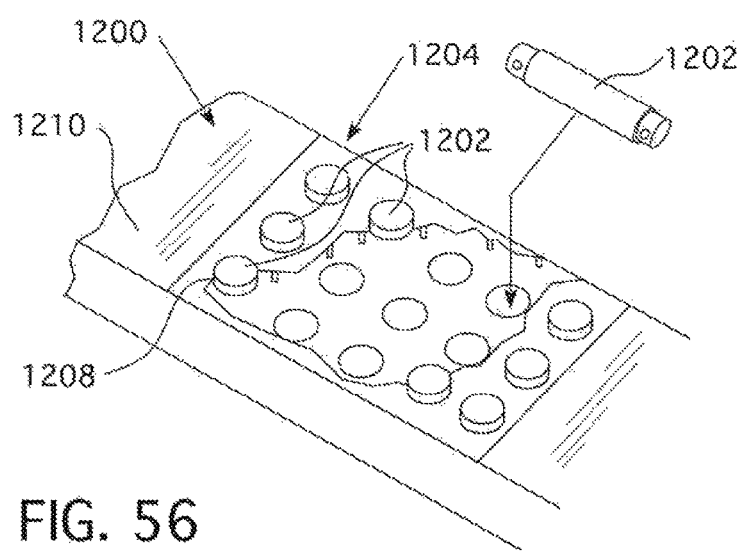
FIG. 56 illustrates a handheld device comprising one or more compliant actuator modules as described hereinbefore in accordance with one embodiment the present invention.

FIG. 56 illustrates a handheld device 1200 comprising one or more compliant actuator modules 1202 as described hereinbefore in accordance with one embodiment the present invention. The one or more compliant actuator modules 1202 are similar to the compliant actuator modules 500 described hereinbefore. The handheld device 1200 comprises a compliant (e.g., rubber) dome keypad 1204 with an integrated compliant actuator modules 1202. Soft compliant active buttons 1206 projects through holes 1208 defined in a hard housing 1210 of the handheld device 1200. The active buttons 1206 may be employed in other products such as handset housings, game controllers, headphone cushions, among other products.

As for other details of the present invention, materials and alternate related configurations may be employed as within the level of those with skill in the relevant art. The same may hold true with respect to process-based aspects of the invention in terms of additional acts as commonly or logically employed. In addition, though the invention has been described in reference to several examples, optionally incorporating various features, the invention is not to be limited to that which is described or indicated as contemplated with respect to each variation of the invention. Various changes may be made to the invention described and equivalents (whether recited herein or not included for the sake of some brevity) may be substituted without departing from the true spirit and scope of the invention. Any number of the individual parts or subassemblies shown may be integrated in their design. Such changes or others may be undertaken or guided by the principles of design for assembly.

Although generally described herein in terms of a solid dielectric elastomer transducer roll, those skilled in the art will recognize that the present invention is equally applicable to all types of transducer architecture including dielectric elastomer rolls, solid dielectric elastomer rolls, and dielectric elastomer multi-layer stacks.

Various aspects of the subject matter described herein are set out in the following numbered clauses in any combination thereof:

1. An apparatus, comprising a substrate; a dielectric elastomer transducer electrically coupled to the substrate; and a compliant electrically conductive housing coupled to the dielectric elastomer transducer.

2. The apparatus according to clause 1, further comprising an electrically insulative coating interposed between the dielectric elastomer transducer and the compliant electrically conductive housing.

3. The apparatus according to one of clauses 1 and 2, further comprising: first electrically conductive terminals located on a top surface of the substrate to electrically couple the dielectric elastomer transducer to the substrate.

4. The apparatus according to clause 3, further comprising second electrically conductive terminals located on a bottom surface of the substrate to electrically couple the dielectric elastomer transducer to an external device, wherein the first and second electrically conductive terminals are electrically coupled.

5. The apparatus according to clause 4, further comprising one or more conductive via through-holes electrically coupling the first and second electrically conductive terminals through the substrate.

6. The apparatus according to any one of clauses 1 to 5, wherein the compliant electrically conductive housing comprises a conductive material embedded in an electrically insulative material or laminated between a first and a second sheet of electrically insulative material.

7. The apparatus according to clause 6, wherein the electrically insulative material comprises at least one member selected from the group consisting of a polyurethane, a silicone, an acrylate, a styrenic copolymer, an olefinic copolymer, an olefinic polymer, a fluoroelastomer, a rubber, and a thermoplastic polyurethane.

8. The apparatus according to any one of clauses 1 to 7, wherein the compliant electrically conductive housing is electrically coupled to a low impedance shield.

9. An apparatus, comprising a first housing defining an opening; a substrate; a dielectric elastomer transducer electrically coupled to the substrate; and a compliant electrically conductive second housing coupled to the dielectric elastomer transducer, wherein a portion of the compliant electrically conductive housing projects through the opening defined in the first housing.

10. The apparatus according to clause 10, further comprising a support to fixedly attach the substrate to the first housing.

11. The apparatus according to one of clauses 9 and 10, further comprising a flex circuit electrically coupled to the substrate.

12. The apparatus according to any one of clauses 9 to 11, comprising electrical terminals provided on the first housing to electrically couple the dielectric elastomer transducer to an energy source; and a mass located within the first housing and fixedly coupled to the one end of the dielectric elastomer transducer; wherein the other end of the dielectric elastomer transducer is fixed coupled to the first housing; and wherein the other end of the mass is free floating.

13. A method, comprising attaching electrical terminals to a substrate; attaching a dielectric elastomer transducer to the electrical terminals; and applying an electrically insulative coating on the dielectric elastomer transducer. end of the dielectric elastomer transducer; wherein the other end of the dielectric elastomer transducer is fixedly coupled to the first housing; and wherein the other end of the mass is free floating.

14. The method according to clause 13, further comprising applying a compliant electrically conductive housing over the dielectric elastomer transducer.

15. The method according to clause 14, further comprising applying a conductive material composite formed by laminating a conductive material between a first and a second electrically insulative sheet or embedding a conductive material within an electrically insulating material.

16. The method according to clause 15, further comprising applying a potting compound to a portion of the conductive material composite and applying the potted portion to the dielectric elastomer transducer.

17. The method according to clause 16, further comprising attaching the conductive material composite to the dielectric elastomer transducer.

18. The apparatus according to any of clauses 1 to 12 wherein the transducer architecture is one selected from the group consisting of dielectric elastomer rolls, solid dielectric elastomer rolls, and dielectric elastomer multilayer stacks.

19. The apparatus according to any of clauses 6 to 8 wherein the conductive material is at least one selected from the group consisting of conductive fabric, conductive polymer, conductive composite, or corrugated metal foil.

20. The apparatus according to any of clauses 15 to 18, wherein the conductive material is at least one selected from the group consisting of conductive fabric, conductive polymer, conductive composite, or corrugated metal foil.

Also, it is contemplated that any optional feature of the inventive variations described may be set forth and claimed independently, or in combination with any one or more of the features described herein. Reference to a singular item, includes the possibility that there are plural of the same items present. More specifically, as used herein and in the appended claims, the singular forms "a," "an," "said," and "the" include plural referents unless the specifically stated otherwise. In other words, use of the articles allow for "at least one" of the subject item in the description above as well as the claims below. It is further noted that the claims may be drafted to exclude any optional element. As such, this statement is intended to serve as antecedent basis for use of such exclusive terminology as "solely," "only" and the like in connection with the recitation of claim elements, or use of a "negative" limitation. Without the use of such exclusive terminology, the term "comprising" in the claims shall allow for the inclusion of any additional element—irrespective of whether a given number of elements are enumerated in the claim, or the addition of a feature could be regarded as transforming the nature of an element set forth in the claims. Stated otherwise, unless specifically defined herein, all technical and scientific terms used herein are to be given as broad a commonly understood meaning as possible while maintaining claim validity.

What is claimed is:

1. An apparatus, comprising:
   a substrate;
   a dielectric elastomer transducer electrically coupled to the substrate; and
   a compliant electrically conductive housing coupled to the dielectric elastomer transducer.

2. The apparatus according to claim 1, further comprising an electrically insulative coating interposed between the dielectric elastomer transducer and the compliant electrically conductive housing.

3. The apparatus according to claim 1, further comprising first electrically conductive terminals located on a top surface of the substrate to electrically couple the dielectric elastomer transducer to the substrate.

4. The apparatus according to claim 3, further comprising second electrically conductive terminals located on a bottom surface of the substrate to electrically couple the dielectric elastomer transducer to an external device, wherein the first and second electrically conductive terminals are electrically coupled.

5. The apparatus according to claim 4, further comprising one or more conductive via through-holes electrically coupling the first and second electrically conductive terminals through the substrate.

6. The apparatus according to claim 1, wherein the compliant electrically conductive housing comprises a conductive material embedded in an electrically insulative material or laminated between a first and a second sheet of electrically insulative material.

7. The apparatus according to claim 6, wherein the electrically insulative material comprises at least one member selected from the group consisting of a polyurethane, a silicone, an acrylate, a styrenic copolymer, an olefinic copolymer, an olefinic polymer, a fluoroelastomer, a rubber, and a thermoplastic polyurethane.

8. The apparatus according to claim 1, wherein the compliant electrically conductive housing is electrically coupled to a low impedance shield.

9. An apparatus, comprising:
a first housing defining an opening;
a substrate;
a dielectric elastomer transducer electrically coupled to the substrate; and
a compliant electrically conductive second housing coupled to the dielectric elastomer transducer, wherein a portion of the compliant electrically conductive housing projects through the opening defined in the first housing.

10. The apparatus according to claim 9, further comprising a support to fixedly attach the substrate to the first housing.

11. The apparatus according to claim 1, further comprising a flex circuit electrically coupled to the substrate.

12. The apparatus according to claim 1, comprising:
electrical terminals provided on the first housing to electrically couple the dielectric elastomer transducer to an energy source; and
a mass located within the first housing and fixedly coupled to the one end of the dielectric elastomer transducer; wherein the other end of the dielectric elastomer transducer is fixedly coupled to the first housing; and
wherein the other end of the mass is free floating.

13. A method comprising:
attaching electrical terminals to a substrate;
attaching a dielectric elastomer transducer to the electrical terminals;
applying an electrically insulative coating on the dielectric elastomer transducer and;
applying a compliant electrically conductive housing over the dielectric elastomer transducer.

14. The method according to claim 13, further comprising applying a conductive material composite formed by laminating a conductive material between a first and a second electrically insulative sheet or embedding a conductive material within an electrically insulating material.

15. The method according to claim 14, further comprising applying a potting compound to a portion of the conductive material composite and applying the potted portion to the dielectric elastomer transducer.

16. The method according to claim 15, further comprising attaching the conductive material composite to the dielectric elastomer transducer.

17. The apparatus according to claim 1, wherein the transducer has an architecture selected from the group consisting of dielectric elastomer rolls, solid dielectric elastomer rolls, and dielectric elastomer multi-layer stacks.

18. The apparatus according to claim 1, wherein the conductive material is at least one selected from the group consisting of conductive fabric, conductive polymer, conductive composite, or corrugated metal foil.

19. The apparatus according to claim 1, wherein the conductive material is at least one selected from the group consisting of conductive fabric, conductive polymer, conductive composite, or corrugated metal foil.

* * * * *